(12) United States Patent
Millyard et al.

(10) Patent No.: US 11,240,618 B2
(45) Date of Patent: Feb. 1, 2022

(54) LOUDSPEAKER WITH DYNAMICALLY CONTROLLED PAIRS OF VOICE COIL SECTIONS

(71) Applicant: TYMPHANY ACOUSTIC TECHNOLOGY LIMITED, Taipei (TW)

(72) Inventors: Ruben Minoru Tuemp Millyard, Taipei (TW); George Albert Bullimore, Taipei (TW)

(73) Assignee: TYMPHANY ACOUSTIC TECHNOLOGY LIMITED, Taipei (TW)

( * ) Notice: Subject to any disclaimer, the term of this patent is extended or adjusted under 35 U.S.C. 154(b) by 0 days.

(21) Appl. No.: 16/784,639

(22) Filed: Feb. 7, 2020

(65) Prior Publication Data
US 2021/0058725 A1    Feb. 25, 2021

Related U.S. Application Data

(60) Provisional application No. 62/890,962, filed on Aug. 23, 2019.

(51) Int. Cl.
| | |
|---|---|
| *H03F 3/181* | (2006.01) |
| *H04R 3/00* | (2006.01) |
| *H04R 7/12* | (2006.01) |
| *H04R 9/06* | (2006.01) |
| *H04R 29/00* | (2006.01) |

(Continued)

(52) U.S. Cl.
CPC ............ *H04R 29/003* (2013.01); *G10L 25/21* (2013.01); *G10L 25/51* (2013.01); *H03F 3/181* (2013.01); *H03G 3/301* (2013.01); *H04R 3/00* (2013.01); *H04R 7/12* (2013.01); *H04R 9/025* (2013.01); *H04R 9/046* (2013.01); *H04R 9/06* (2013.01);

(Continued)

(58) Field of Classification Search
CPC ..... G10L 25/21; G10L 25/51; H03F 2200/03; H03F 3/181; H03G 2201/103; H03G 3/301; H04R 2209/041; H04R 29/003; H04R 3/00; H04R 7/12; H04R 9/025; H04R 9/046; H04R 9/06
USPC ......................................................... 381/59
See application file for complete search history.

(56) References Cited

U.S. PATENT DOCUMENTS 5,828,767 A * 10/1998 Button ................... H04R 9/046
                                                                    381/401

FOREIGN PATENT DOCUMENTS

JP              54076132 A  *  6/1979  ............... H04R 9/06

* cited by examiner

*Primary Examiner* — Vivian C Chin
*Assistant Examiner* — Friedrich Fahnert
(74) *Attorney, Agent, or Firm* — Muncy, Geissler, Olds & Lowe, P.C.

(57) ABSTRACT

A method for driving a voice coil of a loudspeaker may include providing a magnetic circuit having an air gap, providing a voice coil suspended in the air gap, and applying an audio signal to the voice coil to move it along a travelling axis. The voice coil comprises a main voice coil section, and a pair of auxiliary voice coil sections arranged along the travelling axis with auxiliary voice coil sections arranged respectively on either side of the main voice coil section. Applying an audio signal comprises continuously coupling a main driving signal based on the audio signal to the main voice coil and selectively coupling an auxiliary driving signal based on the audio signal to the pair of auxiliary voice (Continued)

coil sections. The disclosed embodiments further relate to a voice coil driving system and a loudspeaker comprising a voice coil driving system.

68 Claims, 12 Drawing Sheets

(51) Int. Cl.
*G10L 25/21* (2013.01)
*G10L 25/51* (2013.01)
*H03G 3/30* (2006.01)
*H04R 9/02* (2006.01)
*H04R 9/04* (2006.01)

(52) U.S. Cl.
CPC ... *H03F 2200/03* (2013.01); *H03G 2201/103* (2013.01); *H04R 2209/041* (2013.01)

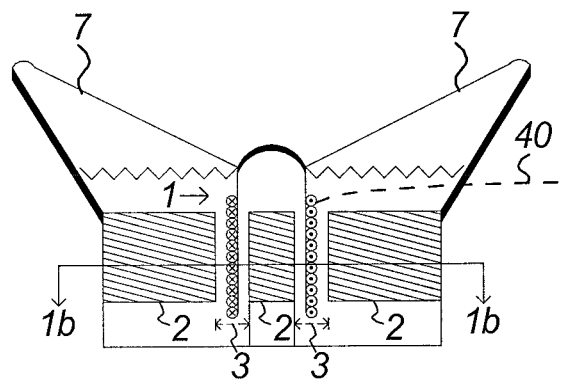
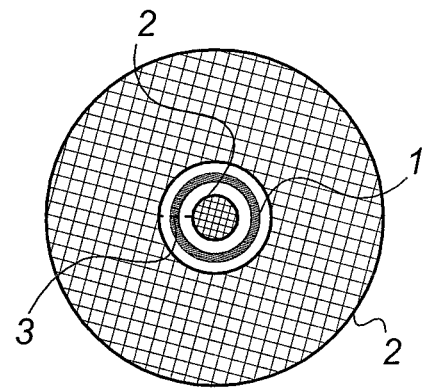
Fig. 1a (prior art)  Fig. 1b (prior art)
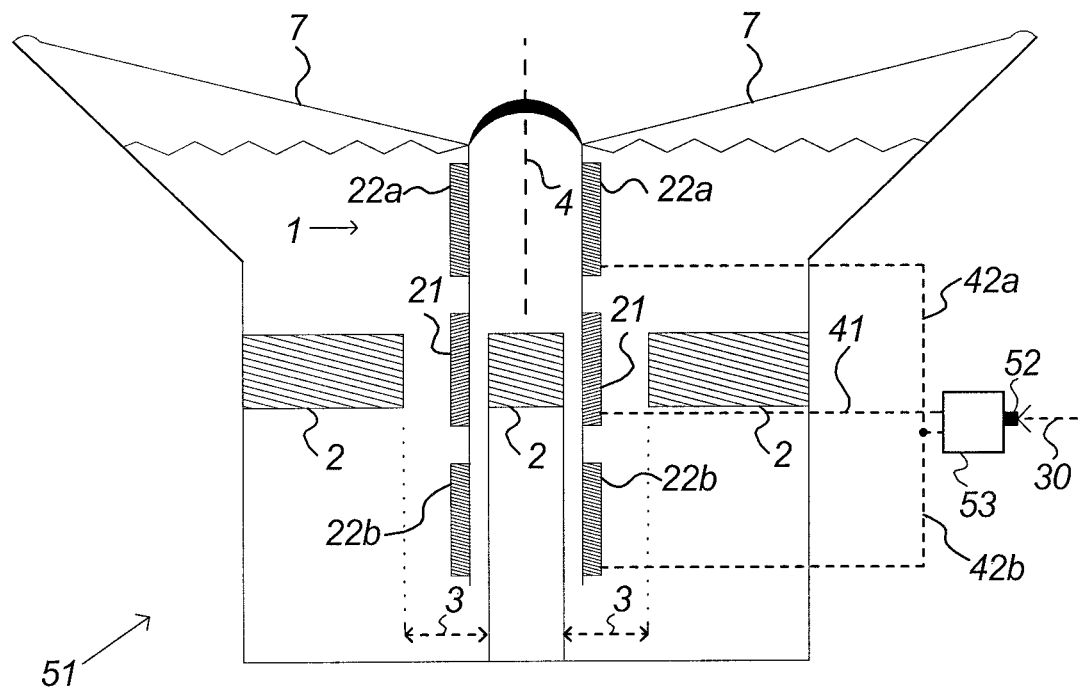
Fig. 2

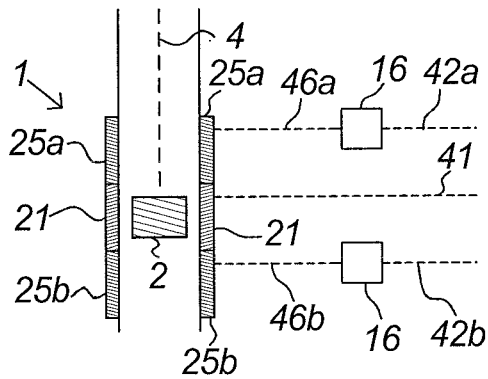
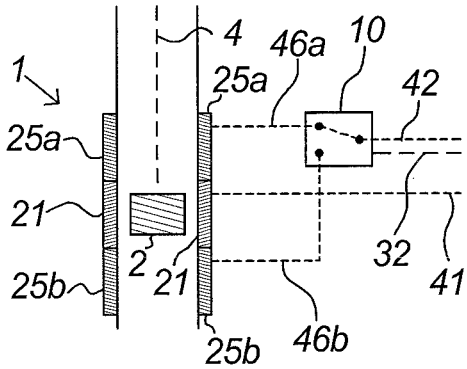
Fig. 14a    Fig. 14b
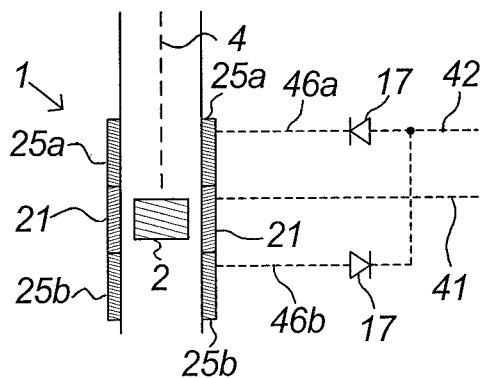
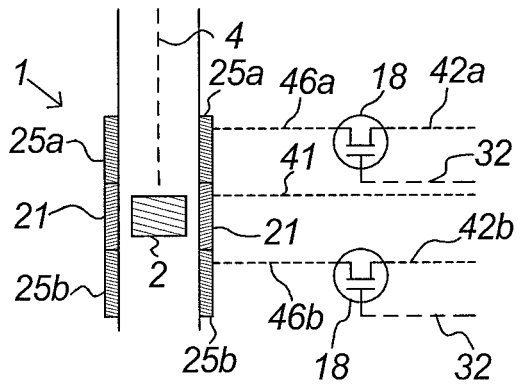
Fig. 14c    Fig. 14d
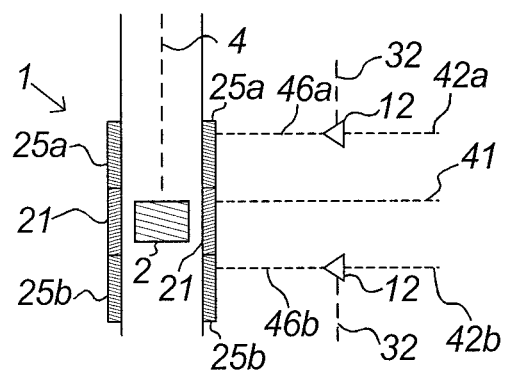
Fig. 14e

LOUDSPEAKER WITH DYNAMICALLY CONTROLLED PAIRS OF VOICE COIL SECTIONS

CROSS-REFERENCE TO RELATED APPLICATION

This application claims benefit of U.S. Provisional Application No. 62/890,962 filed Aug. 23, 2019, which is hereby incorporated by reference in its entirety.

FIELD OF THE INVENTION

The present invention generally relates to a loudspeaker, and more particularly to a voice coil arrangement to improve power handling and to reduce power consumption of the driving electronics.

BACKGROUND

Referring to FIG. 1a-1b, a loudspeaker 50 in the art is illustrated. The loudspeaker 50 is equipped with a voice coil 1 comprising a plurality of coil windings. The coil windings are powered by a driving power, such that the voice coil 1 reciprocally actuates the diaphragm 7 which generates an acoustic sound signal.

The coil windings are partially disposed within an air gap 3 of a magnetic circuit 2, where regions having the highest magnetic flux density are located. When the coil windings are powered, they interact with the magnetic field of the magnetic circuit 2 to produce an electromotive force for translating the voice coil 1. However, only the windings of the voice coil 1 substantially disposed within the gap 3 provide a substantial force to reciprocally translate the voice coil 1. While the windings of the voice coil outside the air gap 3 do not contribute to the generation of significant electromotive force, these windings are powered and, as a result, contribute to voice coil heating, which can be a major limiting factor in loudspeaker design.

SUMMARY

The inventors have identified the above-mentioned problems and challenges related to voice coil efficiency and heating, and subsequently made the below-described invention which may increase efficiency and/or reduce voice coil heating.

An aspect of the invention relates to a method for driving a voice coil of a loudspeaker comprising:
providing a magnetic circuit having an air gap and a voice coil suspended in said air gap;
applying an audio signal to said voice coil suspended in said air gap to produce an electromotive force moving said voice coil along a travelling axis;
wherein said voice coil comprises a plurality of voice coil sections, said plurality of voice coil sections comprising a main voice coil section, and a pair of auxiliary voice coil sections arranged along said travelling axis with voice coil sections of said pair of auxiliary voice coil sections arranged respectively on either side of said main voice coil section; and
wherein said step of applying an audio signal comprises continuously coupling a main driving signal based on said audio signal to said main voice coil section and selectively coupling an auxiliary driving signal based on said audio signal to said pair of auxiliary voice coil sections.

A voice coil may include a coil of wire which under the influence of a magnetic field may generate an electromotive force to move a diaphragm of a loudspeaker in order to produce acoustic sounds. The magnetic field may be established by a magnet, such as a permanent magnet or an electromagnet, present in a magnetic circuit. The magnetic circuit may comprise an air gap in which the voice coil reciprocates to produce acoustic sound by reciprocating the diaphragm of the loudspeaker. The reciprocation of the voice coil occurs in response to application of an audio signal to be reproduced by the loudspeaker. The reciprocating excursion, i.e. reciprocating displacements, of the voice coil of the loudspeaker results in acoustic reproduction of the applied audio signal because the reciprocations of the voice coil may be transferred onto a diaphragm of the loudspeaker which pushes on the air and thereby generates acoustic sound waves.

As used herein, a travelling axis includes an axis along which the voice coil may reciprocate. The travelling axis may be arranged perpendicular to said air gap.

A voice coil of a loudspeaker works on the principle of the Lorentz force, which is the force generated when a current-carrying conductor is placed in a magnetic field. In the case of a voice coil for a loudspeaker, the magnetic field is present in the air gap of the magnetic circuit. When current is applied to the coil, an electromotive force is generated, and the magnitude of the force is proportional to the applied current. Thus, by increasing the current in a driving signal, e.g. by increasing the amplitude of the driving signal, the resulting electromotive force increases which further results in an increased excursion, i.e. displacement, of the voice coil within the limitations of the loudspeaker.

An audio signal may include any suitable type of electronic signal. In various embodiments the audio signal may be an analog audio signal. In various other embodiments the audio signal may be a digital audio signal. When referring to the amplitude of an audio signal, it may in the case of an analog audio signal be understood as the amplitude of an analog audio signal, or it may in the case of a digital audio signal be understood as the audio signal level of a digital audio signal.

According to various embodiments of the invention, the voice coil may comprise a plurality of voice coil sections, including one or more pairs of voice coil sections.

When the voice coil is driven and thus translates/reciprocates along the traveling axis, the voice coil sections move in and out of the air gap, depending on the direction and amplitude of translation.

A voice coil section may include an individual segment of a voice coil. The voice coil sections may be electrically or galvanically isolated from each other or may include subsections of a single coil with multiple connections which provide for individual electrical or galvanic connections to each voice coil section.

In an embodiment of the invention, the voice coil includes a main voice coil section and a pair of auxiliary voice coil sections with one voice coil section of said pair of auxiliary voice coil sections arranged on either side of said main voice coil section along the direction of said travelling axis. In an embodiment, said voice coil may be divided into a central main voice coil section and two surrounding auxiliary voice coil sections. Each of these voice coil sections may have a height, defined in a direction along said travelling axis of one third of the total height of the voice coil defined in a direction along said travelling axis. In various embodiments, the voice coil sections may have the same or different heights, number of windings, density of windings, and comprise windings of the same or different materials. The material of the windings of the voice coil sections may be selected from the list consisting of alloys, aluminium, silver, copper or gold, or any combinations thereof.

To drive the voice coil, a main driving signal, based on the audio signal, is coupled to at least one main voice coil section, whereas an auxiliary driving signal, also based on the audio signal, is only selectively coupled to a pair of auxiliary voice coil sections. The selective coupling of an auxiliary driving signal to a pair of auxiliary voice coil sections may be performed by controlling one or more switching units and/or one or more amplifiers to apply an auxiliary driving signal to both constituents of the pair of auxiliary voice coil sections.

In an embodiment of the invention, said main driving signal and said auxiliary driving signal are similar, i.e. it may be understood that the signals are identical (or substantially identical) with regards to amplitude. In another embodiment of the invention, the two signals are different, i.e. the two signals may differ in amplitude.

By continuously coupling a main driving signal is understood that a main coil driving signal based on said audio signal is applied to the main voice coil section at a consistent level while an audio signal is provided to the voice coil.

The selective coupling of an auxiliary driving signal may be performed on the basis of an excursion demand. Excursion demand may be understood as an amount of excursion, or displacement from rest, of the voice coil which is required for the reproduction of the audio signal.

As an example, for low-amplitude audio signals where low excursions/small displacements are needed to reproduce the audio signal, the necessary electromotive force may be provided by the main voice coil section, and the auxiliary voice coil sections may not contribute significantly to the electromotive force reciprocating the voice coil. Thus, there may be times, during which an audio signal is applied to said voice coil, where an auxiliary driving signal is not be coupled to pairs of auxiliary voice coil sections, and typically an idle auxiliary driving signal is applied to pairs of auxiliary voice coil sections. This idle auxiliary driving signal may be arranged to minimize current and power loss in the auxiliary voice coil section winding's when excursion is low.

For, high-amplitude audio signals, it may be possible for pairs of auxiliary voice coil sections to contribute in the generation of an electromagnetic force, and an auxiliary driving signal may be selectively coupled to pairs of auxiliary voice coil sections such that the pairs of auxiliary voice coil sections contribute to the generation of electromotive force. Thus, there may be times, during which an audio signal is applied to said voice coil, where an auxiliary driving signal is coupled to pairs of voice coil sections.

The disclosed embodiments may also include a method of driving a voice coil of a loudspeaker. The segmented design of the voice coil and the method of selectively applying a driving signal to pairs of auxiliary voice coil sections allows the excursion to reproduce an audio signal (similar to conventional loudspeakers that have an unsegmented voice coil and a traditional driving method). However, because the selective coupling of an auxiliary driving signal to the pair of auxiliary voice coil sections, according to the disclosed embodiments, allows avoiding providing a driving signal to auxiliary voice coil sections for small excursions, both power consumption and voice coil heating may be significantly reduced. Additionally, the opportunity to modify specifically the auxiliary driving signal allows corrections of nonlinearities in the voice coil system. A nonlinearity may be understood as a nonlinear response of the voice coil system, e.g. a nonlinear relation between the restoring force acting on the voice coil and the excursion of the voice coil, which may introduce unwanted distortions at large voice coil excursions.

According to an embodiment of the invention said selectively coupling of said auxiliary driving signal to said pair of auxiliary voice coil sections is performed on the basis of a representation of excursion demand.

A representation of excursion demand may be understood as an instruction as to how much excursion of the voice coil is required to reproduce said audio signal. The representation of excursion demand may be expressed in any suitable way which may represent a required voice coil excursion. As an example, the representation of excursion demand may be expressed in units of millimeters of displacement from the equilibrium position of the voice coil within the air gap when no electromotive force is applied to the voice coil.

In an embodiment of the invention, said representation of excursion demand is provided on the basis of an audio signal, a driving signal, a current and/or voltage signal in a voice coil sections, a signal obtained from a measurement of the excursion, e.g. by voice coil position sensors, or combinations of any of the above In an embodiment of the invention, said representation of excursion demand is provided on the basis of a signal analysis of said audio signal. The signal analysis may be performed by a signal processor, such as a digital signal processor, which takes the audio signal, or a representation thereof, as an input signal. The signal analysis may also be based on a mathematical representation of the acoustic system.

The signal analysis may comprise analysis of an average of a signal amplitude, an envelope of a signal, the present amplitude of a signal, but the signal analysis is not limited to these examples only. A signal analysis may be performed on a present signal value, past signal values, and/or future signal values. If a signal analysis is performed on future signal values of the audio signal, a time delay may be introduced between the time of reception of the audio signal and time of couplings of corresponding driving signals to voice coil sections of the voice coil.

In embodiments of the invention, the signal analysis comprises performing a prediction of the peak voice coil excursion, where the coupling of auxiliary coil sections is based on multiple audio signal cycles. An audio signal cycle may be understood as the duration of time between the voice coil crossing its resting position, i.e. its natural position when no audio signal is applied, two times from the same travelling direction along the travelling axis.

A representation of the excursion demand may also depend on the frequency response of the loudspeaker. In the field of loudspeakers, frequency response typically describes the frequency dependence of the excursion in relation to the frequency of a driving signal. Thus, a representation of the excursion demand may comprise both the audio signal and the frequency response of the voice coil and/or diaphragm.

An excursion estimator may be used to determine the representation of the excursion demand, e.g. based on a transfer function that is derived from the system excursion vs frequency measurements. In systems with significant non-linearity, this may be compensated for using a level dependent family of transfer functions for the excursion estimation or the transfer function closest to the excursion transition point of coupling the pair of auxiliary voice coil sections can be selected.

According to various embodiments of the invention, when the selective coupling is based on excursion demand, the excursion of the voice coil may be able to reproduce an applied audio signal. Since the driving signals are only selectively coupled in some time periods, as dictated by the excursion demand, the power consumption and excess heating may thereby be reduced.

According to various embodiments of the invention, excursion of the voice coil is performed to reproduce an audio signal without distortion, while an auxiliary driving signal is only selectively coupled to auxiliary voice coil sections when a required excursion cannot be provided by the main voice coil section alone. The selective coupling may be performed on the basis of a representation of excursion demand.

According to an embodiment of the invention, the selective coupling of the auxiliary driving signal to the pair of auxiliary voice coil sections may be performed on the basis of a comparison of said representation of excursion demand with a representation of predetermined excursion level thresholds.

In various embodiments, the representation of excursion demand may include a parameter, the representation of a predetermined excursion level may include a threshold related to the parameter, and the comparison may include determining whether the parameter has crossed the threshold. If the threshold is crossed, the auxiliary driving signal may be coupled to the pair of auxiliary voice coil sections.

In various embodiments of the invention, a prediction of the peak voice coil excursion is compared to a predetermined peak voice coil excursion threshold or table of thresholds, i.e. a representation of a predetermined excursion level. The prediction and comparison may be performed by a signal processor such as a digital signal processor. If the predicted peak voice coil excursion is greater than threshold values, an auxiliary driving signal may be coupled to a pair of auxiliary voice coil sections. This coupling may comprise the coupling of a transitional auxiliary driving signal having a varying signal amplitude. According to these embodiments, changes to the driving signal amplitude may occur progressively over multiple audio signal cycles to reduce distortion caused by the signal amplitude changes. The slew rate of the driving signal amplitude change may be chosen such that distortion effects may be shifted to less audible frequencies or to frequencies where the acoustic system is less sensitive in order to render them inaudible to the listener.

In other embodiments of the invention, the representation of the excursion demand is based on measurements of voice coil excursion, and the representation of a predetermined excursion level is a threshold level which is compared with the measurement of voice coil excursion. An auxiliary driving signal may then be coupled to auxiliary voice coil sections when the measured excursion exceeds a corresponding threshold level.

According to an embodiment of the invention, said step of selectively coupling an auxiliary driving signal to said pair of auxiliary voice coil sections is performed by a voice coil controller comprising a signal processor.

In various embodiments, the selective coupling of an auxiliary driving signal to auxiliary voice coil sections may be performed by a voice coil controller. The voice coil controller may comprise a signal processor, such as a digital signal processor. The voice coil controller may perform any tasks related to the comparison of a representation of excursion demand with a representation of a predetermined excursion level. The voice coil controller may further perform tasks related to delaying an audio signal or providing multiple processed audio signals as a basis for multiple driving signals.

According to an embodiment of the invention, said signal processor of said voice coil controller is a digital signal processor.

In various embodiments, the selective coupling of an auxiliary driving signal to auxiliary voice coil sections is performed by a voice coil controller which comprises a digital signal processor. The digital signal processor may perform tasks related to the comparison of a representation of excursion demand with a representation of a predetermined excursion level. A digital signal processor may further perform tasks related to delaying an audio signal or providing multiple processed audio signals as a basis for multiple driving signals.

According to embodiments of the invention, the voice coil comprises more than one main voice coil section and/or more than one pair of auxiliary voice coil sections arranged around main voice coil sections along the travelling axis.

According to embodiments of the invention, said voice coil may comprise any number of pairs of auxiliary voice coil sections, such as two or more pairs of auxiliary voice coil sections, arranged along the travelling axis, which are arranged to be pairwise selectively coupled to auxiliary driving signals, e.g. based on the voice coil excursion and/or the audio signal, such as on the basis of an analysis of the audio signal. In various embodiments of the invention, the combination of voice coil geometry and relative amplitude of driving signals provided to any voice coil sections is adjusted to ensure a linear response of the voice coil to an applied audio signal up to an excursion which is similar to the height of the voice coil. Linear response may be understood as a linear relation between the audio signal and the excursion.

According to an embodiment of the invention, said pair of auxiliary voice coil sections includes a first pair of auxiliary voice coil sections, and said auxiliary driving signal is a first auxiliary driving signal; wherein said plurality of voice coil sections further comprises a second pair of auxiliary voice coil sections arranged along said travelling axis with voice coil sections of said second pair of auxiliary voice coil sections arranged respectively on either side of said first pair of auxiliary voice coil sections; and wherein said step of applying an audio signal comprises selectively coupling a second auxiliary driving signal to said second pair of auxiliary voice coil sections on the basis of said audio signal.

In various embodiments of the invention, the voice coil may include a main voice coil section, a first pair of auxiliary voice coil sections is arranged around the main voice coil section, and a second pair of auxiliary voice coil sections is arranged around the first pair of auxiliary voice coil sections. Both pairs may be arranged along the travelling axis. Thereby, the main voice coil section and the first pair of auxiliary voice coil sections are located between the two voice coil sections of the second pair of auxiliary voice coil sections along the travelling axis.

When an audio signal is applied, which requires an excursion for which the main voice coil section can provide on its own motion, only the main voice coil section is coupled with a driving signal. If an audio signal requires an excursion larger than what the main voice coil section can provide for on its own, but no larger than what the first pair of auxiliary voice coil sections and main voice coil section can provide for in combination with the main voice coil section, the main voice coil section is coupled to a main driving signal, and the first pair of auxiliary voice coil sections is coupled to an auxiliary driving signal. If an audio signal requires an excursion larger than what the first pair of auxiliary voice coil sections can provide for in combination with the main voice coil section, the main voice coil is coupled to a driving signal, the first pair of auxiliary voice coil sections is coupled to a driving signal, and the second pair of auxiliary voice coil sections is coupled to a driving signal.

According to embodiments of the invention, the main driving signal, the first auxiliary driving signal, and the second auxiliary driving signal may all be the same or may all be different. Additionally, any combination of two of the driving signals may be the same with a third driving signal being different. For example, the main driving signal and the first auxiliary driving signal may be identical signals, and the second auxiliary driving signal may be different from the main driving signal. By different, the auxiliary driving signal may have a lower amplitude than the main driving signal (e.g., having a reduced gain compared to the main driving signal).

The selective coupling of auxiliary driving signals may be performed on the basis of at least one representation of excursion demand and at least one representation of a predetermined excursion level. In various embodiments of the invention in which the voice coil comprises two pairs of auxiliary voice coil sections, i.e. a first pair of auxiliary voice coil sections and a second pair of auxiliary voice coil sections, a representation of excursion demand may be compared with two representations of predetermined excursion levels—one predetermined excursion level associated with each pair of auxiliary voice coil sections. If the representation of excursion demand meets a predetermined criterion in a comparison with one of the representations of predetermined excursion levels, a driving signal is coupled to the corresponding pair of auxiliary voice coil sections associated with said representation of predetermined excursion level. And if the representation of excursion demand further meets a predetermined criterion in a comparison with the other of the representations of predetermined excursion levels, a driving signal is coupled to that other pair of auxiliary voice coil sections associated with the other representation of predetermined excursion level. In the comparison of the representation of excursion demand with representations of predetermined excursion levels, it is thus possible to fulfil criteria for coupling multiple auxiliary driving signals to pairs of auxiliary voice coil sections simultaneously.

A predetermined criterion may include any criterion for the comparison of a representation of excursion demand with a representation predetermined of excursion level which, when fulfilled, allows for coupling of auxiliary driving signal. As an example, the predetermined criterion may be fulfilled when a representation of excursion demand is equal to or greater than a representation of predetermined excursion level.

Representations of excursion demand, representations of predetermined excursion levels, comparisons of these, and criteria for selective coupling of auxiliary voice coil sections, may be the same for embodiments of the invention wherein the voice coil comprises a single pair of auxiliary voice coil sections.

According to an embodiment of the invention, said representation of a predetermined excursion level is a first representation of a predetermined excursion level and wherein said selectively coupling said second auxiliary driving signal to said second pair of auxiliary voice coil sections is performed on the basis of a comparison of said representation of excursion demand with a second representation of predetermined excursion level.

The second representation of predetermined excursion level may be greater than the first representation of predetermined excursion level such that the second pair of auxiliary voice coil sections are first selectively coupled for greater representations of excursion demand than the first pair of auxiliary voice coil sections.

According to an embodiment of the invention, said pair of auxiliary voice coil sections is arranged along said travelling axis and arranged symmetrically around said main voice coil section with one auxiliary voice coil section of said pair of auxiliary voice coil sections on either side of said main voice coil section.

In various embodiments, at least one pair of auxiliary voice coil sections is arranged around a central main voice coil section. Since a linear response of the voice coil is preferred, it may be advantageous to distribute each individual pair of auxiliary voice coils symmetrically along the axis of translation, relative to the central main voice coil section. The plane of symmetry may be defined by a main voice coil section that is perpendicular to the axis of translation. Thus, the plane of symmetry intersects the center of the main voice coil section, and voice coil sections of a pair of voice coil sections may have the same length and arrangements of coil windings that are symmetrical with respect to the plane of symmetry.

According to an embodiment of the invention, said first pair of auxiliary voice coil sections is arranged symmetrically around said main voice coil section with one auxiliary voice coil section of said first pair of auxiliary voice coil sections on either side of said main voice coil section, and said second pair of auxiliary voice coil sections is arranged along said travelling axis and arranged symmetrically around said main voice coil section with one auxiliary voice coil section of said second pair of auxiliary voice coil sections on either side of said main voice coil section.

In various embodiments, at least two pairs of auxiliary voice coil sections are arranged around a central main voice coil section. Since a linear response of the voice coil is preferred, it may be advantageous to distribute each individual pair of auxiliary voice coils symmetrically along the axis of translation, relative to the central main voice coil section. The plane of symmetry may thus be defined by a main voice coil section and that is perpendicular to the axis of translation. Thus, the plane of symmetry intersects the center of the main voice coil section, and voice coil sections of a pair of voice coil sections have the same length and arrangements of coil windings that are symmetrical with respect to the plane of symmetry In some embodiments with one main voice coil section and two pairs of auxiliary voice coil sections, a first pair of auxiliary voice coil sections is symmetrically arranged around the main voice coil section, and a second pair of auxiliary voice coil sections is symmetrically arranged around the first pair of auxiliary voice coil sections, both pairs along the travelling axis. As such, the main voice coil section and the first pair of auxiliary voice coil sections may be located between the two constituents of the second pair of auxiliary voice coil sections along the travelling axis.

According to an embodiment of the invention, said selectively coupling of an auxiliary driving signal to said pair of auxiliary voice coil sections comprises controlling at least one amplifier to couple said auxiliary driving signal to said pair of auxiliary voice coil sections.

In embodiments of the invention wherein the voice coil comprises two or more pairs of auxiliary voice coil sections, the two or more corresponding auxiliary driving signals may be provided by one or more amplifiers. As an example, a first auxiliary driving signal for a first pair of auxiliary voice coil sections and a second auxiliary driving signal for a second pair of auxiliary voice coil sections may be coupled using a single two-channel amplifier where the two channel may be controlled independently of each other. Alternatively, each of the two auxiliary driving signals may be coupled using a corresponding separate amplifier, e.g. single channel amplifiers.

In some embodiments, an audio signal or a processed audio signal may be provided to an amplifier connected to an auxiliary voice coil section. When criteria for coupling the auxiliary voice coil section are fulfilled according to the invention, a controller allows the amplifier to be powered in order to amplify the audio signal to generate an auxiliary driving signal, which is provided to the auxiliary voice coil section by means of a channel of amplification. When criteria for coupling the auxiliary voice coil section are not fulfilled according to the invention, a controller allows less or no power to the amplifier such that an idle auxiliary driving signal is generated to be provided to the auxiliary voice coil section. The idle auxiliary driving signal may thus be a version of the auxiliary driving signal with a reduced amplitude.

In some cases, no driving signal is required. In some embodiments the auxiliary driving signal may alternatively be coupled in or out by means of a trigger or enable input of the amplifier, by providing or removing the input to the amplifier, by switching the amplifier output on or off, etc.

Furthermore, a transitional auxiliary driving signal may be provided to auxiliary voice coil sections by controlling the amplification of the auxiliary driving signal. In other words, the gain of the auxiliary driving signal may be controlled by modifying the small-scale input signal as desired and amplifying it by a predetermined amplification, and/or by receiving an unmodified small-scale input signal and adjusting the amplification instead. For class-D amplifiers, the amplification may for example be adjusted by adjusting the power supply and/or the pulse generation of the control signals.

According to an embodiment of the invention, said controlling at least one amplifier comprises generating said auxiliary driving signal, or an idle auxiliary driving signal, and/or a transitional auxiliary driving signal on the basis of said comparison of said representation of excursion demand with a representation of a predetermined excursion level.

In various embodiments, at least one amplifier is controlled to generate either an auxiliary driving signal, an idle auxiliary driving signal, or, optionally, a transitional auxiliary driving signal, all based on an audio signal. An audio signal or a processed audio signal may be provided to an amplifier connected to an auxiliary voice coil section. When criteria for coupling an auxiliary driving signal to a pair of auxiliary voice coil sections are fulfilled, a voice coil controller allows the amplifier to be powered or otherwise become enabled, which amplify the audio signal to generate an auxiliary driving signal, which is provided to the auxiliary voice coil section. When criteria for coupling the auxiliary voice coil section are not fulfilled, the voice coil controller allows less or no power to the amplifier or otherwise may disable it or reduce its amplification, such that an idle auxiliary driving signal is generated to be provided to the auxiliary voice coil section. The idle auxiliary driving signal may include a version of the auxiliary driving signal with a significantly reduced amplitude. In some cases, no idle auxiliary driving signal may be required.

Furthermore, a transitional auxiliary driving signal may be generated by controlling the power to the amplifier or otherwise controlling its amplification. Preferably, the transitional auxiliary driving signal may be generated by providing a gain which lies in the range between the gain which is provided to the amplifier to generate the auxiliary driving signal and the gain which is provided to the amplifier to generate the idle auxiliary driving signal.

According to an embodiment of the invention, said continuously coupling of a main driving signal to said main voice coil section may include coupling of said main driving signal by use of an amplifier.

As such, the main driving signal may be continuously coupled to the main voice coil section by means of an amplification channel, such as an electrical channel, which couples the amplifier to the main voice coil section. In an embodiment of the invention, the same amplifier may also be used to couple an auxiliary driving signal. This may be possible, for example, when using an amplifier comprising two or more independently controlled channels of amplification.

The individual voice coil sections of a segmented voice coil may have different geometries, e.g. different number of windings, winding densities, voice coil section heights etc. Therefore, it may be advantageous for an auxiliary driving signal selectively coupled to auxiliary voice coil sections to have a signal gain which is different from the gain of the main driving signal which is coupled to the main voice coil section. In various embodiments the relative gains may be selected to ensure a linear response of the voice coil to an applied audio signal.

Different gains in the auxiliary driving signal and main driving signal may also be used in an embodiment to compensate for non-linearities in the voice coil suspension and magnet system at large excursions.

The gain of a driving signal may be understood as the amplitude of the driving signal relative to the input signal or the voltage gain of the driving signal.

The individual voice coil sections of a segmented voice coil may have similar geometries, e.g. same number of windings, winding densities, voice coil section heights etc. Therefore, it may be advantageous for an auxiliary driving signal selectively coupled to auxiliary voice coil sections to have a signal amplitude which is the same as the amplitude of a main driving signal which is coupled to a main voice coil section when excursion demand is high. In various embodiments, the relative amplitudes may be selected to ensure a linear response of the voice coil to an applied audio signal.

According to an embodiment of the invention, said selectively coupling of an auxiliary driving signal to said pair of auxiliary voice coil sections may include controlling at least one switch to couple said auxiliary driving signal to said pair of auxiliary voice coil sections.

According to embodiments of the invention, switches may be utilized to control the selective coupling of an auxiliary driving signal to auxiliary voice coil sections. As such, in some cases, an auxiliary driving signal may always be generated, but coupled to auxiliary voice coil sections only when a switch is controlled to couple the signal. When the auxiliary driving signal is not coupled to auxiliary voice coil sections, the auxiliary voice coil sections may be coupled to an idle auxiliary driving signal, or, optionally, to a transitional auxiliary driving signal. An idle auxiliary driving may include no signal, as a switch may leave the input and/or output to the auxiliary voice coil section open, such that no current and/or voltage is supplied to the auxiliary voice coil section. Alternatively, an idle auxiliary driving signal may include a version of the auxiliary driving signal with a reduced amplitude and may be coupled to an auxiliary voice coil section using a switch, while the auxiliary driving signal is not coupled.

In various embodiments, the auxiliary driving signal may be composed of several signals. As such, in these embodiments, a first driving signal may be provided to a pair of auxiliary voice coil sections, and to selectively couple an auxiliary driving signal to the pair of auxiliary voice coil sections a second driving signal may be added to the first, i.e. the idle auxiliary driving signal may be composed of a first driving signal, and the auxiliary driving signal may be composed of a sum of a first driving signal and a second driving signal. The selective addition of a second driving signal to generate the auxiliary driving signal may be controlled by a switch.

A switch may include an electrical component or device, built with discrete components or integrated in an integrated circuit or processor, that can interrupt the current or divert it from one terminal of the switch to another terminal of the switch, such that the diversion of the current dictates whether a driving signal is coupled or not.

In various embodiments, combinations of switches and amplifiers are used to generate and couple the auxiliary driving signals.

According to an embodiment of the invention, an idle auxiliary driving signal may be coupled to said pair of auxiliary voice coil sections when the transducer excursion demand is low.

Coupling an idle auxiliary driving signal, also referred to as a base signal, to pairs of auxiliary voice coil sections in addition to the selectively coupling of the auxiliary driving signal, means that the idle or base signal may be coupled to the auxiliary voice coil sections at times where the auxiliary driving signal is selectively not coupled. The idle auxiliary driving signal may be a small signal compared to the main driving signal, but with frequency content synchronized with the main driving signal, such as a low-amplitude version of the main driving signal. In some embodiments, the pairs of auxiliary voice coil sections may continuously receive, as long as an audio signal is applied, at least the idle auxiliary driving signal. In other words, in such embodiments, the selective coupling does not cause the auxiliary voice coil section to be turned on and off, but to change between being supplied with an idle signal and being supplied with the full auxiliary driving signal.

An advantage of supplying the idle auxiliary driving signal instead of completely decoupling the auxiliary voice coil section is that effects of back EMF braking may be avoided or reduced. Back EMF braking is an unwanted disruption, i.e. braking, of the reciprocating motion of the voice coil due to induction of current in a voice coil section which under some circumstances may result in energy loss and distortions in the reproduction of the audio signal. The voice coil sections will induce currents in each other, due to magnetic coupling. Additionally, the voice coil sections will also generate an EMF due to the motion relative to the magnet gap. The main voice coil section may be continuously driven by the continuously coupled main driving signal. A voice coil section which is not actively driven, e.g. the pair of auxiliary voice coil sections during times where the auxiliary driving signal is not coupled, will therefore draw a small amount of the energy generated by the nearby active voice coil section, i.e. the main voice coil section, out of the magnetic system, most significantly when the auxiliary voice coil section is close to the magnetic field of the air gap. Thereby the inactive voice coil section works against the active voice coil section, and the electromotive force caused by the main voice coil in the air gap is slightly reduced as some of the energy is now used to energize the inactive nearby voice coil sections. To avoid or reduce this undesired effect, the idle auxiliary driving signal serves to apply a voltage bias that compensates for the back EMF generated from the coil motion and inductive coupling of the active to the inactive voice coil sections to reduce or minimize the power dissipation in these sections when they are not needed. As only a relatively small idle auxiliary signal, e.g. in the magnitude of 5 to 25% of the main driving signal, is sufficient for this purpose, the overall advantages of the invention may still be preserved, such as reduction of the power consumption and voice coil heating by not supplying full scale signals to the auxiliary voice coil sections when they can be adequately reproduced by the main voice coil section alone, and such as the possibility to use the auxiliary voice coil sections to compensate for nonlinearities in the voice coil system.

According to an embodiment of the invention, said idle auxiliary driving signal may be based on said audio signal.

The idle auxiliary driving signal may be based on the audio signal and may therefore be regarded as a representation of the audio signal. This may be highly advantageous in order to use the idle auxiliary driving signal to reduce back EMF braking, as the idle auxiliary driving signal should make the auxiliary voice coil section cooperate with the forces produced by the main voice coil section instead of working against them.

According to an embodiment of the invention, said idle auxiliary driving signal may include a first idle auxiliary driving signal, and said pair of auxiliary voice coil sections may include a first pair of auxiliary voice coil sections, and wherein a second idle auxiliary driving signal may be coupled to a second pair of auxiliary voice coil sections.

The second idle auxiliary driving signal may also be based on the audio signal and may therefore be regarded as a representation of the audio signal.

According to embodiments of the invention, one or more pairs of auxiliary voice coil sections, such as a first and a second pair of auxiliary voice coil sections, may receive idle auxiliary driving signals. An idle auxiliary driving signal may be a representation of the audio signal having a reduced amplitude and or a phase shift or delay applied (e.g., a signal characterized by a negative gain, an attenuated driving signal, a delayed driving signal, an IIR or FIR filtered driving signal, etc.). In some embodiments, an idle auxiliary driving signal may be a driving signal having no amplitude, i.e. a null signal. This may be relevant particularly for embodiments with two or more pairs of auxiliary voice coil sections, where the second, or outer, pair of auxiliary voice coil sections are far from the air gap and thus does not contribute significantly to the undesired back EMF braking anyway. For mid-scale audio signals where the inner auxiliary voice coil sections are fully activated to reproduce the audio signals, the outer auxiliary voice coil sections couple with the inner voice coil sections and a non-zero idle auxiliary driving signal may also be applied to the outer, or second, auxiliary voice coil sections.

According to an embodiment of the invention, said first idle auxiliary driving signal and said second idle auxiliary driving signal are different driving signals.

When the voice coil comprises two or more pairs of auxiliary voice coil sections, the different pairs of auxiliary voice coil sections may receive idle auxiliary driving signals having different gains and or phase, e.g. different voltage gain, phase, or different amplitudes. As described above, the outer pair of the auxiliary voice coil pairs will not contribute significantly to the back EMF braking for small audio signals, and may therefore be applied with a smaller or even zero idle auxiliary driving signal. However, in an alternative embodiment of the invention, the two idle auxiliary driving signals may be substantially identical, i.e. having the same gain.

According to an embodiment of the invention, the idle auxiliary driving signal amplitude may be adjusted on the basis of the audio signal, such as based on an analysis of an amplitude of the audio signal. Such an analysis may be performed by a voice coil controller comprising a signal processor, e.g. a digital signal processor. In embodiments, the low-scale idle auxiliary driving signal may be dimensioned as a small signal relative to the voltage, current or power of the main driving signal.

According to an embodiment of the invention, the gain of the idle auxiliary driving signal may be adjusted on the basis of the audio signal, such as based on an analysis of the amplitude of the audio signal. Such an analysis may be performed by a voice coil controller comprising a signal processor, e.g. a digital signal processor, and may be determined by processing the audio input signal using FIR or IIR digital filters.

By analyzing the audio signal by e.g. a voice coil controller comprising a signal processor, such as a digital signal processor, it may be possible to predict future excursion demands. For example, a look ahead buffer may be implemented that may affect how the auxiliary coil driving signal is applied. As an example, a signal analysis of the audio signal may reveal that an excursion demand of a certain amount is required within a certain time period, and in order to meet this demand the auxiliary driving signal may be applied to the pair of auxiliary voice coil section before the exclusion is needed. Instead of immediately energizing the auxiliary coils, the auxiliary coil driving signal may be applied during the time period and gradually ramped to the desired gain for the predicated excursion level. By gradually increasing and/or decreasing the gain/phase of the transitional auxiliary driving signal, as opposed to abrupt switching on/off the desired transitional auxiliary driving signal, distortion in the reproduction of the audio signal due to signal level changes in the auxiliary coils may be reduced or eliminated.

According to an embodiment of the invention, said gain adjustment of said changes to the auxiliary driving signal may be slew rate limited.

The changes to the auxiliary driving signal may, as described above, be advantageous in that it offers gradual application of the pair of auxiliary voice coil sections depending on the need, contrary to embodiments with simple switching on/off of the auxiliary driving signal, e.g. jumping between different levels immediately Therefore, it may be advantageous to limit the degree of adjustment of the auxiliary driving signal gain. In other words, is may be advantageous to require that the transition between low and high gains, or vice versa, is made relatively slowly.

To this purpose, a slew rate limitation may be implemented. A limitation in the magnitude of e.g. a max 10 dB/s gain slew rate may be advantageous to avoid audible artifacts from the selective coupling of the auxiliary driving signals. This may also be achieved using a mixer with various exclusion level auxiliary signals as inputs and using a slew rate limited control signal to change the mixer input output ratio gradually from one level to another.

The slew rate of the auxiliary voice coil section transition may be precisely controlled, e.g. by a digital signal processor, to reduce or minimize distortion or increase efficiency depending on target application. For example, faster transition may result in higher efficiency at the expense of increased distortion.

According to an embodiment of the invention said magnetic circuit may be provided by a magnet.

In an embodiment of the invention a magnetic flux of the magnetic circuit may be provided by a single magnet.

According to an embodiment of the invention said magnet may be a permanent magnet.

Using a permanent magnet may have the benefit that a simple magnetic circuit may be provided, which is low in production costs, and which provides a steady and reliable magnetic flux to the air gap.

In an embodiment of the invention the permanent magnet includes a ring magnet.

In an embodiment of the invention the permanent magnet is made of a material selected from one or more of iron, neodymium, neodymium iron boron (NdFeB), samarium cobalt (SmCo), ceramic materials such as $BaFe_2O_3$ or $SrFe_2O_3$, or Alnico, e.g., compositions comprising Al, Ni and Co.

According to an embodiment of the invention said magnet includes an electromagnet.

By using an electromagnet, the magnetic flux of the magnetic circuit may be adjustable. This may provide for an additional way of controlling the reciprocation of the voice coil within the air gap.

According to an embodiment of the invention, said main voice coil section may have a height measured in a direction along said travelling axis which is greater than a height of said air gap measured in said direction along said travelling axis.

Conventional loudspeakers include both so-called overhung voice coils of heights greater than the height of the air gap along the travelling axis, and so-called underhung voice coils of heights smaller than the height of the air gap along the travelling axis. The height of the air gap is in this disclosure focuses on the extension of the air gap along the traveling axis, rather than on the narrow distance between the magnet or pole parts forming the air gap.

A voice coil section which has a height greater than the height of the air gap along the travelling axis may be referred to as an overhung coil section. Having an overhung main voice coil section may be advantageous in that the main voice coil section may always fill out the entire air gap height for audio signals requiring only small levels of excursions of the voice coil. An overhung main voice coil section may further provide the advantage that pairs of auxiliary voice coil sections do not need to be energized by auxiliary driving signals as they would not contribute anyway, and thus for low amplitude signals, coupling of auxiliary driving signals may be avoided and thereby distortions, which could result from such switching, may thus be reduced or avoided. When the audio signal requires greater excursions than what the main voice coil section can provide on its own motion, pairs of auxiliary voice coil sections may then be utilized to provide additional electromotive force for reciprocation of the voice coil.

According to an embodiment of the invention, each voice coil section of said pair of auxiliary voice coil sections may have a height measured in a direction along said travelling axis which is smaller than said height of said main voice coil section.

According to an embodiment of the invention, each voice coil section of said second pair of auxiliary voice coil sections may have a height measured in a direction along said travelling axis which is smaller than said height of said main voice coil section.

In some applications of the invention, pairs of auxiliary voice coil sections may only be needed for further increasing the travelling reach of the voice coil, however the main part of the electromotive force may still be provided by the main voice coil sections. In such applications, it may be advantageous if the height of voice coil sections of auxiliary pairs of voice coil sections are smaller than the height of the main voice coil section. If the total height of the voice coil increases, the mass of the voice coil may also increase, and this may influence the frequency response of the voice coil such that the voice coil may become less responsive to high frequency signals due to its greater inertia.

According to embodiments of the invention, the height of any of the individual voice coil sections may be smaller than the height of the air gap along the travelling axis.

According to embodiments of the invention, the height of any of the individual voice coil sections may be greater than the height of the air gap along the travelling axis.

According to embodiments of the invention, a combined height of the individual voice coil sections may be greater than the height of the air gap along the travelling axis.

According to embodiments of the invention, the height of any of the individual voice coil sections may be the same height as the air gap along the travelling axis, and in alternative embodiments of the invention the combined height of the individual voice coil sections may be the same height as the air gap along the travelling axis.

According to an embodiment of the invention, said selective coupling of an auxiliary driving signal based on said audio signal comprises maintaining said coupling for a duration of time comprising two or more zero-crossings of said audio signal. For example, amplitude changes to the auxiliary coil signal would occur progressively over a number of zero crossings of the main driving signal. The rate of zero crossing's or time period between the zero crossing can be important as it indicates the dominant low frequency component of the audio signal. Therefore, making the auxiliary coil gain changes over multiple cycles of the dominant low frequency portion of the audio signal can reduce or minimize audibility of distortion generated by any changes in auxiliary coil signals.

A zero-crossing of said audio signal refers to a point in time in the audio signal in which the amplitude, such as voltage, passes though the zero point.

Maintaining the coupling of the selectively coupled auxiliary driving signal for a duration of time including several zero crossing or a period of time may be advantageous in that fewer distortions in time may be present in the reproduced audio signal in comparison with an auxiliary driving signal which is coupled for a time duration comparable to a typical period of oscillation of the voice coil. Even small errors in the switching point when coupling driving signals in and out one or more times each oscillation, may lead to distortion as the switching is happening at the same or similar frequency as the driving signal.

In this sense, the selective coupling of the auxiliary driving signal comprising maintaining the coupling for several zero crossings or time period, may be regarded as a 'slow' or hesitant or hysteresis coupling, i.e. the coupling is maintained over a time duration greater than a characteristic time duration of oscillations of the voice coil, regardless of the excursion demand decreasing in the meantime. In an embodiment, the slow acting selective coupling, i.e. time-delayed selective coupling may be applied for deactivating the auxiliary voice coil sections, whereas coupling the auxiliary driving signal may be performed after (e.g., as soon as possible after) the excursion demand exceeds the predetermined excursion threshold for the pair of auxiliary voice coil sections. In that sense, the maintaining of the coupling for a duration of time may also be considered a peak-hold feature used to prevent changes in the voice coil mix during frequent peaks in the audio signal, and for that purpose the duration of time may be advantageously set to a few periods of the lowest desired frequency of the system, e.g. 500-500 ms.

The maintaining of the auxiliary driving signal coupling for several zero crossings may be particularly advantageous together with the above-described feature of adjustable auxiliary driving signal with slew rate limitation of the gain, whereby errors in the excursion prediction may only result in a small increase of low order distortion effects, as the coil transitions slew rate may slow relative to the driving signal bandwidth. Additionally, this distortion may be avoided by enabling the pair of auxiliary voice coil sections earlier or at a lower excursion at the expense of overall efficiency.

According to embodiments of the invention in which selectively coupling of an auxiliary driving signal comprises coupling a transitional auxiliary driving signal, said duration of time may refer to a duration of time in which the gain or amplitude of the transitional auxiliary driving signal is maintained at a constant value of gain or amplitude or phase, such as a constant value of gain or amplitude established on the basis of a signal analysis of the audio signal.

According to an embodiment of the invention, said duration of time may be a predetermined duration of time.

The predetermined duration of time may include any duration of time which exceeds a characteristic time of oscillation of the voice coil, e.g. the period of oscillation of the voice coil. The period of oscillation of the voice coil depends on the frequencies of the driving signals applied to the voice coil sections, however at the lowest frequencies recognizable by the human ear, such as 20 Hz the corresponding period of oscillation is 50 milliseconds. Thus, a predetermined duration of time greater than 50 milliseconds, would for most audio signals imply that an auxiliary driving signal is coupled to a pair of auxiliary voice coil sections for a duration of time exceeding an oscillation of the voice coil.

According to an embodiment of the invention, said predetermined duration of time may be established on the basis of a signal analysis of said audio signal.

An analysis of the audio signal may prescribe that one or more auxiliary driving signals are selectively coupled to one or more respective pairs of auxiliary voice coil sections for a predetermined time duration. The predetermined duration of time may be establish one or more times during the application of the audio signal, such as a plurality of times, and each consecutive selectively coupling of the auxiliary driving signal may last for a different predetermined time duration.

By analyzing the audio signal, it may be possible to predict when large excursions of the voice coil are needed where one or more pairs of auxiliary voice coil sections may have to be coupled to auxiliary driving signals.

The signal analysis of the audio signal may be performed by a digital signal processor, such as the digital signal processor of the voice coil controller.

According to an embodiment of the invention said main driving signal and said auxiliary driving signal are delayed by a time delay with respect to said audio signal.

The driving signals, i.e. main driving signal and auxiliary driving signals such as idle auxiliary driving signals and transitional auxiliary driving signals may be delayed for a short time duration, e.g. a time delay, also referred to as look-ahead delay, such as a time duration of a few milliseconds to a few hundred milliseconds. The amount of delay may be preferably selected in consideration of the lowest frequency content to be handled, e.g. 20 Hz, or e.g. higher for the tweeter drivers of two- or three-way speakers, for example such that prediction can be established based on at least one and preferably several periods of the lowest frequency content foreseen. The delay may allow for certain types of signal analysis to be performed on the audio signal before driving signals are applied to voice coil sections. Such an analysis may be used to establish future predictions of excursion demands, e.g. representations of excursion demand, based on shorter or longer signal content.

Thus, a signal analysis of the audio signal in the context of a time delay may include an analysis performed on parts of the audio signal which have not yet been reproduced using driving signals.

According to an embodiment of the invention, said signal analysis may be performed on a section of time of said audio signal.

By a section of time may be understood a short window of time in which the audio signal may be analysed to establish a basis for the coupling of driving signals, such as a main driving signal and auxiliary driving signals such as idle auxiliary driving signals and transitional auxiliary driving signals.

In some embodiments, the audio signal may be analysed within a section of time which extends from the present time and back for a short duration Thus, the audio signal which has been applied to the voice coil in this past short duration may be used as a basis for the selective coupling of auxiliary voice coils. As an example, an analysis of the already applied audio signal may conclude that the number of high peaks in the audio signal per time has been very high, and therefore the predetermined duration of time for the selective coupling of auxiliary driving signals may be chosen such that the auxiliary driving signals are maintained for a time duration exceeding the typical time in-between such high peaks. At a later point in time in the audio signal where a previous history of peaks in the driving signal, as already applied to voice coil sections, reveals that the number of high peaks in the audio signal per time is lowered, the predetermined duration of time may be reduced accordingly such that power consumption of the voice coil may be reduced. In some cases, this section of time may be identical to the time delay.

When analyzing a section of time, such as a time window, which relates to a part of the audio signal which has not been reproduced by the voice coil yet, due to the time delay, or look-ahead delay, that time window may have a duration which is identical to the time delay or look-ahead delay. This makes sense, in that an analysis of an audio signal, which is simultaneously being reproduced, cannot extend beyond the time duration of the time delay. If the look-ahead delay is 50 milliseconds, then the analysis can only be performed on a time window which is shorter or equal to 50 milliseconds. In some cases, this signal analysis of said audio signal may comprise peak-analysis of said audio signal.

In various embodiments, the selective coupling may be based on a prediction of the peak voice coil excursion within the time window. If the prediction of the peak voice coil excursion results in a predicted voice coil excursion exceeding one or more thresholds, one or more auxiliary driving signals may be coupled to auxiliary voice coil sections. Such thresholds may be predetermined excursion levels.

An analysis of the audio signal within the time window may provide a prediction of a peak voice coil excursion demand, which is greater than one or more thresholds, and accordingly auxiliary driving signals may be coupled to pairs of auxiliary voice coil sections. In this sense, appropriate auxiliary driving signals may be applied to pairs of auxiliary voice coil sections prior to a section of the audio signal where the corresponding excursion demand is called for. In other words, pairs of auxiliary voice coil sections may be coupled to auxiliary voice coil sections prior to the coupling being deemed necessary for providing the required excursion as dictated by the audio signal. This premature coupling may allow for e.g. smooth selective couplings of transitional auxiliary driving signals.

The time window representing a time section of the audio signal may establish an environment for prediction of the required excursion demand for that time window, and such a prediction may be provided on the basis of an analysis of the audio signal within the time window, such as an analysis of a maximum peak in the amplitude of the audio signal within the time window, or an analysis of any other parameter relating to the audio signal within the time window.

As an example, the predetermined time duration for the selective coupling of auxiliary driving signals may be established for a given time window and may be established multiple times in consecutive time windows of the signal analysis. In an embodiment of the invention, the predetermined time duration for the selective coupling may be identical to the duration of the time window. The analysis of the audio signal may further prescribe that the selective coupling of the auxiliary driving signal lasts for a predetermined time duration which extends beyond an individual time window, for example extending over the collective time of two or more time-windows.

According to some embodiments, the signal analysis may be performed on said audio signal repeatedly.

The signal analysis may be performed repeatedly on consecutive sections of time of the audio signal for as long as an audio signal is applied.

In some embodiments, the time window may be a dynamic time window, which follows the time progression of the audio signal albeit ahead of time of the applied driving signal due to a possible time delay.

In some cases, the representation of excursion demand may be established on the basis of a signal analysis of said audio signal.

By analyzing the audio signal using signal analysis, in combination with a look-ahead delay, it may be possible to establish predictions of the representation of excursion demand that may be required to reproduce the audio signal during an upcoming time period, for example a time period having a duration which is identical or substantially identical to the time delay. The analysis may be carried out by the voice coil controller which may comprise a signal processor such as a digital signal processor.

In this manner, the voice coil controller may be ahead of time of the reproduced audio signal, i.e. the audio signal as produced by the reciprocation of the voice coil, by a small time-gap. This time-gap may allow the voice coil controller to investigate the audio signal and determine how to respond to changes in the audio signal before a corresponding driving signal has to be applied to the voice coil.

The excursion demand may alternatively or in addition be established from signal analysis of past content of the audio signal, i.e. 'from experience' rather than 'prediction'. Such embodiments avoid the look-ahead delay which may be undesirable e.g. when used together with other audio units or video but may instead rely on the assumption that future signal content is similar to past signal content.

In some embodiments, the representation of excursion demand comprises a property of said audio signal and said representation of a predetermined excursion level may constitute a threshold related to said property of said audio signal.

According to various embodiments, a comparison may be made between a property of the audio signal and a predetermined threshold level of this property. The predetermined threshold level may dictate when to selectively couple a driving signal to auxiliary voice coil sections. The property of the audio signal may be the immediate level of the audio signal, an envelope of the audio signal, a type of average, e.g. RMS, of the audio signal or its amplitude, a peak maximum of the audio signal, or a predicted loudness. The loudness may be understood as a subjective perception of sound pressure produce by a loudspeaker system. If the property of the audio signal is larger than its related threshold, an auxiliary driving signal may be coupled to a pair of auxiliary voice coil sections. According to these various embodiments, the auxiliary driving signal may or may not be coupled to the pair of auxiliary voice coil sections during multiple audio signal cycles.

A comparison of the property of the audio signal with a predetermined threshold level may be performed on the basis of a present audio signal value, past audio signal values, and/or future audio signal values. A prediction of future audio signal values may be established on the basis of on an analysis of the audio signal performed by the voice coil controller.

In some embodiments, a property of said audio signal may relate to an amplitude of said audio signal.

In various embodiments of the invention, the representation of excursion demand may comprise a property of the audio signal, and this property may be the amplitude of the audio signal. The representation of a predetermined excursion level may include an amplitude threshold. Various embodiments may include comparing an amplitude of the audio signal with a threshold level of the amplitude to selectively couple a driving signal to auxiliary voice coil sections. This amplitude may be the present amplitude of the audio signal, the amplitude of an envelope the audio signal, a type of average of the audio signal amplitude, a peak maximum amplitude of the audio signal, or a predicted loudness. If the amplitude of the audio signal is larger than the amplitude threshold, an auxiliary driving signal is coupled to a pair of auxiliary voice coil sections. In these embodiments, the auxiliary driving signal may or may not be coupled to the pair of auxiliary voice coil sections during multiple audio signal cycles.

The comparison of the amplitude of the audio signal with a predetermined amplitude threshold may be performed on the basis of a present audio signal value, past audio signal values, and/or future audio signal values. A prediction of future audio signal values may be performed using a voice coil controller comprising a signal processor, e.g. digital signal processor, in combination with a delay of the audio signal.

In some embodiments, wherein a comparison of a representation of excursion demand with a representation of a predetermined excursion level is performed, the comparison may be performed with a certain frequency, e.g., at certain intervals. It may be advantageous to select a frequency which does not result in distortion. In embodiments with a time window of a certain duration, this duration may serve as a guide for selecting an interval for making the comparisons and thereby decisions, e.g. a short time window may demand selecting short decision intervals in an embodiment to not cause distortion. According to embodiments of the invention, the frequency of the comparison may be in the interval from 10 Hz to 10 MHz.

In various embodiments, the representation of a predetermined excursion level may be set to a fixed value or it may be a dynamic value. A fixed value may be chosen by a person skilled in the art to minimize distortion of the audio signal or to increase power efficiency, depending on target application. A dynamic value may be adjusted manually by a user or automatically, e.g. by a digital signal processor. An automatically adjusted dynamic value may depend on the target application, or the type of audio signal, e.g. speech, music etc., but is not restricted to these examples. In some embodiments, the representation of a predetermined excursion level may also depend on the frequency composition of the audio signal and/or the frequency response of the loudspeaker.

In some embodiments, the coupling of the auxiliary driving signal may be based on a user defined input selection.

A user defined input selection may include a user of a loudspeaker (comprising the voice coil) adjusting a parameter concerning the reproduction of the audio signal. Such a parameter may include the volume or loudness which is desired of the reproduced audio signal. Such an adjustment may be provided by e.g. a volume knob/dial. As an example, if a user selects a high volume or loudness, auxiliary driving signals may need to be applied to one or more pairs of auxiliary voice coil sections in order to provide for the voice coil excursion necessary for providing the reproduction of the audio signal as desired by the user.

According to some embodiments, representation of excursion demand may be based on measuring the voice coil excursion by using at least one position sensor and said representation of a predetermined excursion level may include a threshold related to the excursion of the voice coil.

In some embodiments, the representation of excursion demand may be based on measuring the position of the voice coil with a sensor. These embodiments may comprise sensors based on magnetic means, optical means, acoustic means and/or inductive means, but sensors are not limited to these examples according to the invention.

Various embodiments of the invention comprise comparing a measurement of the voice coil excursion with a predetermined threshold level of the measured voice coil excursion to selectively couple a driving signal to auxiliary voice coil sections. This comparison may be based on the amplitude of the measurement of the voice coil excursion. This amplitude may be the present amplitude, the amplitude of an envelope, a type of average of the amplitude, or a peak maximum amplitude. If the amplitude of the measurement of the voice coil excursion is larger than an amplitude threshold, an auxiliary driving signal may be coupled to a pair of auxiliary voice coil sections. In these embodiments, the auxiliary driving signal may or may not be coupled to the pair of auxiliary voice coil sections during multiple audio signal cycles.

The comparison of a measurement of the voice coil excursion with a predetermined excursion level may be performed on the basis of a present signal value, past signal values, and/or future signal values.

According to some embodiments, the representation of excursion demand may be based on current and/or voltage in the voice coil sections and said representation of a predetermined excursion level may include a threshold related to current and/or voltage in the voice coil sections.

During the application of a driving signal, any voice coil sections may experience an induced current due to the change in the magnetic flux through its coils as it traverses the air gap. Thus, the current in a voice coil section comprises, in addition to the applied driving signal current, an induced current. By measuring and analyzing current and/or voltage in at least one voice coil section it may thus be possible to establish a representation of the excursion demand.

Various embodiments may include comparing a measurement of current and/or voltage in at least one voice coil section with a predetermined threshold level of the measured current and/or voltage to selectively couple a driving signal to auxiliary voice coil sections. This comparison may be based on the amplitude of the induced current and/or voltage. This amplitude may include the present amplitude, the amplitude of an envelope, a type of average of the amplitude, or a peak maximum amplitude. If the amplitude of the induced current and/or voltage is larger than an amplitude threshold, an auxiliary driving signal may be coupled to a pair of auxiliary voice coil sections. In these embodiments, the auxiliary driving signal may or may not be coupled to the pair of auxiliary voice coil sections during multiple audio signal cycles.

The comparison of the current and/or voltage with a predetermined excursion level may be performed on the basis of a present signal value, past signal values, and/or future signal values.

Various embodiments may perform a comparison of a representation of excursion demand and a representation of a predetermined excursion level on the basis of multiple signals, e.g. a comparison based on a combination of the audio signal and current and/or voltage in at least one voice coil section. Such embodiments may increase reliability and/or accuracy in selective coupling of an auxiliary driving signal to auxiliary voice coil sections.

In some embodiments, the pair of auxiliary voice coil sections may include an upper voice coil section and a lower voice coil section, said upper voice coil section and said lower voice coil section arranged respectively on either side of said main voice coil section along said travelling axis.

An upper voice coil section may include a first auxiliary voice coil section of said pair of auxiliary voice coil sections, and a lower voice coil section may include a second auxiliary voice coil section of said pair of auxiliary voice coil sections. The terminology may also be swapped such that the upper voice coil section is a second auxiliary voice coil section and the lower voice coil section is a first auxiliary voice coil section. If the voice coil comprises more pairs of auxiliary voice coil sections, such as a second pair of auxiliary voice coil sections, the members of such a pair may similarly be referred to as a second upper voice coil section and a second lower voice coil section.

In this sense, voice coil members of a pair of auxiliary voice coil sections may be controlled on an individual basis, hence the distinction between an upper voice coil section and a lower voice coil section. Controlling individual voice coil sections of pairs of auxiliary voice sections may be advantageous in that rectifications of auxiliary driving signals may be utilized, and this may further provide the advantageous effects of a lower power consumption of the voice coil and thereby also less excessive voice coil heating.

According to some embodiments, providing an auxiliary driving signal may include providing an upper rectified driving signal to said upper voice coil section and providing a lower rectified driving signal to said lower voice coil section; wherein said upper rectified driving signal is provided by attenuating, such as blocking, a first direction of current of said auxiliary driving signal; wherein said lower rectified driving signal is provided by attenuating, such as blocking, a second direction of current of said auxiliary driving signal; and wherein said first and second direction of current of said auxiliary driving signal are opposite directions of current.

A driving signal provided to a voice coil may comprise current alternating between flowing in a first direction of current and flowing in a second direction of current through the voice coil windings, where the first direction of current and the second direction of current are opposite directions of current. When current flows in a first direction of current through the voice coil windings, an electromotive force may be generated onto the voice coil in a first direction of the travelling axis, and when current flows in a second direction of current through the voice coil windings, an electromotive force may be generated onto the voice coil in a second direction of the travelling axis, where the first direction of the travelling axis and the second direction of the travelling axis are opposite directions along the travelling axis. Thus, forces may be applied to the voice coil in both directions of travel along the travelling axis, and this enables for the reciprocation of the voice coil within the air gap.

In various embodiments of the invention, providing the auxiliary driving signal comprises providing an upper rectified driving signal to the upper voice coil section and providing a lower rectified driving signal to the lower voice coil section. The upper rectified driving signal may be generated by attenuating or blocking a first direction of current of the auxiliary driving signal, whereas the lower rectified driving signal may be generated by attenuating or blocking a second direction of current of the auxiliary driving signal, opposite to the first direction of current.

An attenuation of a current may include a reduction of current and/or voltage of the signal, e.g. an upper rectified driving signal may be generated by attenuating a first direction of current of an auxiliary driving signal, and thus the magnitude of current flow in a first direction of current in the upper rectified driving signal may be smaller than the magnitude of current flow in a first direction of current in the auxiliary driving signal.

Blocking a current may include a reduction of current, such that no substantial current flows after blocking the current.

In various embodiments, as current of an auxiliary driving signal flows in a first direction of current, this current may substantially flow to the lower voice coil section, whereas its flow to the upper voice coil section is attenuated or blocked. Similarly, as current of an auxiliary driving signal flows in a second direction of current, this current may substantially flow to the upper voice coil section, whereas its flow to the lower voice coil section is attenuated or blocked. The upper rectified driving signal and lower rectified driving signals are arranged to provide current flowing in an appropriate direction of current to produce an electromotive force on the voice coil such that the audio signal is correctly reproduced.

Alternatively, in other various embodiments, the flow of current may be reversed such that current flowing in the first direction of current may substantially flow to the upper voice coil section and its flow to the lower voice coil section is attenuated or blocked. And similarly, as current of an auxiliary driving signal flows in a second direction of current, this current may substantially flow to the lower voice coil section, whereas its flow to the upper voice coil section is attenuated or blocked. The upper rectified driving signal and lower rectified driving signals are arranged to provide current flowing in an appropriate direction of current to produce an electromotive force on the voice coil such that the audio signal is correctly reproduced.

In various embodiments, the upper rectified driving signal may be created by passing the auxiliary driving signal through a rectifying unit, e.g. a diode or MOSFET. A rectifying unit may be understood as a unit, device, circuit, or circuit element which processes current asymmetrically. For example, a rectifying unit may respond in a first way to a current in a first direction, and may respond in a second way to a current in a second direction. An example of a rectifying unit includes a diode, which may be characterized by an asymmetric conductance, i.e. low resistance for one direction of current, and high resistance for the opposite direction of current, within the current and/or voltage limitations of the diode. To create the upper rectified signal, a diode may be integrated to block a first direction of current of the auxiliary driving signal, while allowing passage of a second direction of current of the auxiliary driving signal. Thereby, a first direction of current in the upper voice coil section may be attenuated or blocked by the diode. The above description may similarly apply to the creation of the lower rectified driving signal which may similarly be created by passing the auxiliary driving signal through a rectifying unit, e.g. a diode. to block a second direction of current of the auxiliary driving signal, while allowing passage of a first direction of current of the auxiliary driving signal. Thereby, a second direction of current in the lower voice coil section may be attenuated or blocked by the diode.

In other embodiments, the upper and lower rectified driving signals may be provided by a voice coil controller which takes the audio signal as an input signal for processing. The signals may be provided digitally by a digital signal processor of said voice coil controller. The voice coil controller may then provide various driving signals, e.g. a main driving signal, an upper rectified driving signal and a lower rectified driving signal to the corresponding voice coil sections of the voice coil. In this manner, the driving signals may be created in the voice coil controller based on an analysis of the audio signal. In this embodiment, the driving signals may be provided to the voice coil sections via one or more amplifiers, such as one or more amplifiers comprising one or more channels of amplification.

In various embodiments, when the excursion of the voice coil allows the lower voice coil section to contribute substantially to the generation of an electromotive force, the driving signal received by the lower voice coil section may substantially be the auxiliary driving signal. When the excursion is in the opposite direction, i.e. the upper voice coil section is closer to the air gap than the lower voice coil section, the lower rectified driving signal received by the lower voice coil section may be created by attenuating or blocking the auxiliary driving signal, e.g., the lower rectified driving signal may provide no substantial current to the lower voice coil section. Similarly, when the excursion allows the upper voice coil section to contribute substantially to the generation of an electromotive force, the driving signal received by the upper voice coil section may substantially be the auxiliary driving signal. When the excursion is in the opposite direction, i.e. the lower voice coil section is closer to the air gap than the upper voice coil section, the upper rectified driving signal received by the upper voice coil section may be created by attenuating or blocking the auxiliary driving signal, i.e. the upper rectified driving signal may provide no substantial current to the upper voice coil section.

The current provided to the voice coil sections of the segmented voice coil may be reduced due to attenuation or blocking of driving signals. It may be advantageous to block current to voice coil sections which do not contribute in the generation of an electromotive force. In various embodiments, the selective coupling of the auxiliary driving signal to the pair of auxiliary voice coil sections reduce the power consumption of the invention when the excursion demand is low. By additionally integrating one or more rectifying units which process current asymmetrically, e.g. diodes, the disclosed embodiments may be arranged such that the excursion can reproduce the audio signal while further reducing the power consumption and excess heating, since one of the two auxiliary voice coil sections receive reduced or substantially no current when they are selectively coupled.

According to some embodiments, providing said upper rectified driving signal may include processing said auxiliary driving signal using an upper rectifying unit and said providing said lower rectified driving signal comprises processing said auxiliary driving signal using a lower rectifying unit.

An upper rectified signal may be provided by attenuating or blocking a first direction of current of an auxiliary driving signal. Similarly, a lower rectified signal may be provided by attenuating or blocking a second direction of current of an auxiliary driving signal. The attenuation and/or blocking of an auxiliary driving signal may comprise one or more rectifying units.

A rectifying unit may process an auxiliary driving signal by attenuating or blocking one first direction of current or voltage and passing the opposite direction of current or voltage. In various embodiments, a rectifying unit processes the auxiliary driving signal to create an upper rectified driving signal, and another rectifying unit processes the auxiliary driving signal to create a lower rectified driving signal. The processing of the auxiliary driving signal to create an upper rectified driving signal may be characterized by an asymmetric response to the direction of the current or voltage, e.g. current or voltage in a first direction is attenuated or blocked, while current in a second direction is allowed to pass to the upper voice coil section with no substantial attenuation. The processing of the auxiliary driving signal to create a lower rectified signal may be characterized by the opposite asymmetric response, compared to the processing of the auxiliary driving signal to create an upper rectified signal, e.g. current or voltage in a second direction is attenuated or blocked, while current in a first direction is allowed to pass to the lower voice coil section with no substantial attenuation.

The rectifying unit processing the auxiliary driving signal to provide an upper rectified driving signal may also be referred to as an upper rectifying unit and the rectifying unit processing the auxiliary driving signal to provide a lower rectified driving signal may be referred to as a lower rectifying unit.

In various embodiments, the upper rectifying unit and the lower rectifying unit are constructed from similar or identical components, but are integrated into the invention to provide opposite processing of the auxiliary driving signal, e.g. an upper rectifying unit blocks a first direction of current and allows current in a second direction to pass with no substantial attenuation, while a lower rectifying unit blocks a second direction of current and allows current in a first direction to pass with no substantial attenuation.

In practice, a rectifying unit may include a diode, which may be characterized by an asymmetric conductance, i.e. low resistance for one direction of current, and high resistance for the opposite direction of current, within the current and/or voltage limitations of the diode.

In some embodiments, the upper rectifying unit and the lower rectifying unit may refer to the same unit, device, circuit or circuit element, such that this one rectifying unit is capable of providing both an upper rectified driving signal and a lower rectified driving signal on the basis of an auxiliary driving signal. The rectifying unit capable of generating both the upper and lower rectified driving signals may include a rectifying circuit.

A rectification unit may be connected to either connections of a voice coil section.

According to some embodiments, the upper rectified driving signal may be provided by rectifying said auxiliary driving signal in said first direction of current and wherein said lower rectified driving signal is provided by rectifying said auxiliary driving signal in said second direction of current.

According to some embodiments, rectifying may include passive rectifying. Discrete diodes may be used for the passive rectifying. In some cases, the described rectifying of the auxiliary driving signal may include half-wave rectification.

According to some embodiments, the upper rectifying unit may comprise a rectifying circuit, and/or the lower rectifying unit may comprise a rectifying circuit.

In various embodiments, the upper rectifying unit comprises a circuit. Similarly, in various embodiments, the lower rectifying unit comprises a circuit.

In some embodiments, the upper rectifying unit and the lower rectifying unit constitute one circuit, such that this one circuit is capable of providing both an upper rectified driving signal and a lower rectified driving signal on the basis of an auxiliary driving signal.

According to some embodiments, the upper rectifying unit may include a diode and the lower rectifying unit may include a diode.

In various embodiments, the upper rectifying unit may include a diode. Similarly, in various embodiments, the lower rectifying unit may include a diode. A diode may refer to a device characterized by an asymmetric conductance, i.e. low resistance for one direction of current, and high resistance for the opposite direction of current, within the current and/or voltage limitations of the diode. A diode may comprise a semiconductor material. Different types of diodes include point-contact diodes, p-n junction diodes, and Schottky diodes, but the disclosed embodiments are not limited to these diode types. The disclosed embodiments may also include components with properties similar to diodes, e.g. thyristors.

Various diodes may have different characteristics. Diodes typically have two terminals, and within certain characteristic limitations of voltage and/or current, the electrical resistance for current through the diode from one terminal to the other will be different from the electrical resistance of a current of the opposite direction. Often, one direction of current through the diode has a large resistance, such that no substantial current may flow in the diode, up to a breakdown voltage. Current in the opposite direction through the diode may have a low resistance.

Often, a certain cut-in voltage across the diode is required for it to conduct in its direction of low resistance. At a voltage above this cut-in voltage, the diode may have a low resistance and allow substantial current through, and below this cut-in voltage, the diode may not allow substantial current to pass through.

This behavior may allow a diode to be utilized as a rectifying unit.

A diode may allow a reverse current. A reverse current may include a current which can flow through the diode in the direction of current which is characterized by a high resistance. The reverse current may often be significantly smaller than the current of an auxiliary driving signal. Thus, even though a diode allows a reverse current, for most practical embodiments, the reverse current may be insignificant.

According to some embodiments, the upper rectifying unit may include a switch and the lower rectifying unit may include a switch.

A rectifying unit may comprise a switch. Such an arrangement may also be referred to as active rectification or synchronous rectification. A switch may include an electrical component or device, built with discrete components or integrated in an integrated circuit or processor, that can interrupt the current or divert it from one terminal of the switch to another terminal of the switch, such that the diversion of the current dictates whether a driving signal is coupled or not. A switch may be based on a solid-state device such as a transistor, e.g. a metal-oxide-semiconductor field-effect transistor or MOSFET-transistor.

In various embodiments, the upper rectifying unit may include a switch. Similarly, in various embodiments, the lower rectifying unit may include a switch. The switch may be controlled based on the auxiliary driving signal, such that current flow of the auxiliary driving signal in a first direction allows the current of the auxiliary driving signal to be provided to the lower voice coil section, while current to the upper voice coil section is blocked, and current flow of the auxiliary driving signal in a second direction allows the current of the auxiliary driving signal to be provided to the upper voice coil section, while current to the lower voice coil section is blocked.

According to some embodiments, the upper rectifying unit may include an amplifier and the lower rectifying unit may include an amplifier. These amplifiers may amplify an auxiliary driving signal selectively based on the direction of current of the auxiliary driving signal. As such, a first direction of current of the auxiliary driving signal may cause an amplification by the amplifier comprised in the lower rectifying unit, such that an amplified signal is provided to the lower voice coil section, while an amplified signal is not provided to the upper voice coil section. And similarly, a second direction of current of the auxiliary driving signal may cause an amplification by the amplifier comprised in the upper rectifying unit, such that an amplified signal is provided to the upper voice coil section, while an amplified signal is not provided to the upper voice coil section.

The selective amplification based on direction of current of the auxiliary driving signal may comprise current analysis and amplifier control. Current analysis may include determining current amplitude and/or direction. Amplifier control may comprise powering and controlling amplifiers selectively, based on current analysis.

According to some embodiments, a voice coil driving system of a loudspeaker may include:
  a magnetic circuit having an air gap;
  a voice coil suspended in said air gap, said voice coil comprising a plurality of voice coil sections, said plurality of voice coil sections comprising a main voice coil section, and a pair of auxiliary voice coil sections arranged along a travelling axis with voice coil sections of said pair of auxiliary voice coil sections arranged respectively on either side of said main voice coil section; and a voice coil controller arranged to apply an audio signal to said voice coil suspended in the air gap to produce an electromotive force moving said voice coil along said travelling axis, wherein said applying an audio signal comprises continuously coupling a main driving signal based on said audio signal to said main voice coil section and selectively coupling an auxiliary driving signal based on said audio signal to said pair of auxiliary voice coil sections.

A voice coil driving system may include a system which is arranged to produce a driving motion on the basis of an input audio signal, such as an acoustical or digital audio signal. The driving motion, which is produced by the voice coil suspended in the airgap of the magnetic circuit may advantageously be used for reciprocating a diaphragm of a loudspeaker to produce an acoustic sound.

According to an embodiment of the invention said voice coil controller may be arranged to selectively couple said auxiliary driving signal to said pair of auxiliary voice coil sections on the basis of a representation of excursion demand.

According to an embodiment of the invention, said pair of auxiliary voice coil sections may include a first pair of auxiliary voice coil sections and said auxiliary driving signal may include a first auxiliary driving signal and wherein said voice coil further comprises a second pair of auxiliary voice coil sections and said voice controller is arranged to selectively couple a second auxiliary driving signal to said second pair of auxiliary voice coil sections.

The voice coil controller may include a signal processor. In various embodiments, the signal processor may include a digital signal processor. In an embodiment the signal processor is a microprocessor, microcontroller, FPGA (Field Programmable Gate Array) or an ASIC (Application-specific Integrated Circuit), etc. The signal processor may be a dedicated processor for the purpose of the present application or be a general-purpose processor programmed to perform specific tasks associated with the signal processing of audio signals.

The voice coil driving system may include one or more amplifiers.

The two voice coil sections of a pair of auxiliary voice coil sections may be coupled to an auxiliary driving signal provided by a common channel of amplification. In this sense, the amplifier may adjust the amplitude of the driving signal, by adjusting the gain of the audio signal either positively or negatively, according to a representation of excursion demand, and apply that driving signal through one or more channels, e.g. a wire, electrically connecting the amplifier and the pair of auxiliary voice coil sections.

In various embodiments, one or more amplifiers may preferably be included in an integrated circuit, for example as part of an integrated audio power amplifier having a number of channels corresponding to the number of voice coil sections, or pairs of voice coil sections if the pairs are coupled by common channel. Because of the increased power efficiency that may be offered by the disclosed embodiments, each individual amplifier may be rated lower than a single amplifier for a conventional voice coil actuator. In an embodiment, the amplifiers may be integrated with the signal processor. In an embodiment, the amplifiers are Class-D amplifiers, i.e. switch mode amplifiers. In various embodiments, additional signal filtering, e.g. low pass filtering, may be applied before or after the amplifiers.

The voice coil driving system may include a switching unit.

The voice coil controller may be arranged to carry out the method as described in any of the above paragraphs.

A voice coil driving system as described herein may exhibit any or all of the advantages and benefits as described above in relation to the method of driving a voice coil. As such, a loudspeaker according to the present disclosure may provide the beneficial effect of low power consumption and reduction of excessive heating within the loudspeaker due to the efficiency of the segmented voice coil.

Some aspects of the invention may relate to a loudspeaker comprising a diaphragm, an interface configured to receive an audio signal, and a voice coil driving system as described in any of the above paragraphs.

A diaphragm may include a membrane attached to the voice coil, such that the reciprocation of the voice coil within the air gap translates into a reciprocation of the membrane which then produces an acoustic sound.

The audio signal may be provided from an external unit such as an audio source arranged to output an electrical audio signal and with connecting means to deliver the audio signal to the loudspeaker. Examples of connecting means include wired connections such as a cabled connection and wireless connections such as a Bluetooth connection, e.g. Bluetooth A2DP or Bluetooth aptX, or a Wi-Fi connection.

An interface may include a point of reception of an audio signal. The interface may be arranged to receive an audio signal which is transmitted wirelessly, or to receive an audio signal via a wired connection, such as via a jack connection or minijack connection.

A loudspeaker as described herein may exhibit any or all of the advantages and benefits as described above in relation to the method of driving a voice coil. As such, a loudspeaker according to the present invention may provide the beneficial effect of low power consumption and reduction of excessive heating within the loudspeaker due to the efficiency of the segmented voice coil of the voice coil driving system.

BRIEF DESCRIPTION OF THE FIGURES

Various embodiments are described with reference to the following drawings:

FIGS. 1a-1b illustrate aspects of a conventional voice coil driving system,

FIG. 2 illustrates a voice coil driving system with a voice coil comprising a main voice coil section and a pair of auxiliary voice coil sections according to an embodiment of the invention.

FIGS. 14a-14e illustrate various configurations for generating rectified driving signals for an upper and a lower voice coil section on the basis of an auxiliary driving signal according to embodiments of the invention.

DETAILED DESCRIPTION

Figure 3A:
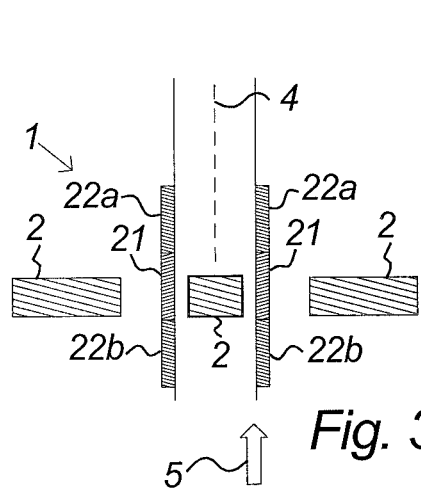
FIGS. 3a-3d illustrate the reciprocating translation of a voice coil comprising three voice coil sections according to embodiments of the invention.

FIG. 1a shows a cut-through view of a conventional loudspeaker. FIG. 1b illustrates a section view at the line 1b-1b in FIG. 1a. Disposed within the loudspeaker are two concentrically aligned magnetic members 2 forming a magnetic circuit. These magnetic members 2 are arranged such that a circular air gap 3 is formed within the magnetic circuit 2.

A voice coil 1 comprising a plurality of coil windings is further suspended within the air gap 3. The windings of the voice coil 1 are arranged such that when an electric current is passed through the coil 1, an electromotive force will translate the voice coil 1 within the air gap 3, such that a membrane or diaphragm 7 is actuated. An alternating current thereby causes a reciprocating movement of the diaphragm 7, which generates an acoustic sound signal.

Referring to FIG. 2, a voice coil driving system 51 according to an embodiment of the invention is illustrated. The voice coil driving system 51 comprises a magnetic circuit 2 formed by two concentrically aligned magnetic members 2. The magnetic members may include permanent magnets or metal poles. The magnetic circuit 2 may be arranged such that a circular air gap 3 is formed within the magnetic circuit 2 terminated by the two magnetic members 2. The circular air gap 3 is a volume of air which takes on the form of a volume disposed between two axially aligned cylinders of different widths.

Various alternative voice coil based loudspeaker configurations known in the technical field of loudspeakers and acoustic transducers may be used, such as those having other configurations of magnetic circuits and air gaps, including various configurations of permanent magnets, pole pieces, front and back plates, casing, and various configurations of air gaps, including circular as described above, linear, polygonal, irregular, one or several air gaps, etc. The present invention is not limited to the magnetic circuit and air gap configuration illustrated in the drawings but may readily be applied to other voice coil-based transducers by the skilled person.

A voice coil 1 is suspended within the air gap 3. The voice coil 1 comprises a plurality of voice coil sections 21 and 22a-b, wherein a main voice coil section 21 is centrally arranged surrounded by a pair of auxiliary voice coil sections 22a-b arranged respectively on either side of said main voice coil section, with all voice coil sections axially aligned along a travelling axis 4 of the voice coil 1. Each voice coil section comprises a plurality of metal windings coiling around the inner magnetic member 2 and a travelling axis 4 as seen in FIG. 2. The voice coil sections may be mechanically coupled, and in some cases electrically coupled, to form the voice coil 1. The mechanical coupling may comprise a support such as a tube, mesh or wire structure of paperboard, plastic or metal, e.g. a foil.

The voice coil sections 21-22b are configured such that when an electric current is passed through a voice coil section 21-22b, located at least partly within the air gap 3 of the magnetic circuit 2, an electromotive force will translate the particular voice coil section 21-22b along the travelling axis 4. Since voice coil sections 21-22b may be mechanically coupled members of the same voice coil 1, an electromotive force generated by any of voice coil sections 21-22b may translate the entire voice coil 1 along the travelling axis 4. The translation of the voice coil 1 along the travelling axis 4 results in the voice coil 1 pushing and pulling in a diaphragm 7 of a loudspeaker 50. The movement of the diaphragm 7 generates an acoustic sound signal.

The coupling of the voice coil 1 and the diaphragm 7 may be established by the above-mentioned mechanical coupling of the voice coil section, e.g. a plastic foil tube, or may involve further support members as known by the skilled person, for example a spider and a diaphragm surround. The idle position of the voice coil 1 may be controlled by the support members, such as a spider and/or a diaphragm surround and frame, as known by the skilled person. In a preferred embodiment, the total voice coil height is centred in the air gap when idle, so that with three voice coil sections as illustrated in the examples, the middle voice coil section is aligned with the magnetic circuit and air gap.

Since the magnetic field is substantially disposed within the air gap 3 in the magnetic circuit 2, only voice coil sections 21-22b that are at least partly positioned within the air gap may generate a substantive electromotive force upon application of an electric current. Generally, the more of a particular voice coil section is contained within the air gap, the higher the force generated upon electric current application. Referring to the instance of time shown in FIG. 2, only voice coil section 21 is fully or partially disposed within the air gap 3, whereas voice coil sections 22a and 22b are disposed completely outside the air gap 3. Since the magnetic field density is highest within the air gap 3, and quickly decreasing outside the air gap 3, in some cases, only voice coil section 21 may generate a substantial electromotive force to translate the voice coil 1, whereas voice coil sections 22a and 22b are located sufficiently far away from the air gap 3 that the efficiency in converting electric driving power into electromotive force is considerably lower, and practically insignificant, compared to the efficiency of converting electric driving power into electromotive force for voice coil section 21.

Windings of voice coil sections 21-22b, located away from the air gap 3 may primarily only contribute to excessive voice coil heating when an electric driving power is applied, and only contribute marginally in translating the voice coil 1 along the travelling axis 4. From these considerations, it may be advantageous to avoid applying power to any voice coil sections 21-22b, e.g. 22a-22b, that are not at least partly disposed within the air gap.

Generally, a loudspeaker system aims to reproduce an audio signal 30 by the excursion of a voice coil 1, where the excursion is the position of the voice coil 1, relative to its resting position. An audio signal 30 may comprise a representation of varying sound intensities, which may require varying excursions for reproduction. Thus, an audio signal 30 may require a range of excursions which can be established by only utilizing the electromotive force which can be generated by the main voice coil section 21, for the audio signal 30 to be reproduced. Another audio signal 30 may require a range of excursions which can only be established by utilising the main voice coil section 21 together with the pair of auxiliary voice coil sections 22a-22b, for the audio signal 30 to be reproduced.

Referring to FIG. 2, voice coil sections 21-22b are electrically connected to a voice coil controller 53. The voice coil controller 53 may be arranged to provide a main driving signal 41 to the main voice coil section 21, and also to establish whether an auxiliary driving signal 42a-42b has to be coupled to the pair of auxiliary voice coil sections 22a-22b at a particular instant in order to reproduce the audio signal. The driving signals 41-42b may be the actual electric signals that passes through the respective voice coil sections 21-22b to generate electromotive force to translate the voice coil 1 along the travelling axis 4. The driving signals 41-42b may be provided to the voice coil sections 21-22b via channels, e.g. cables or wires, preferably electrical connections. As illustrated in FIG. 2, the voice coil controller 53 outputs a common auxiliary driving signal for the pair of auxiliary voice coil sections, which is split up in an individual connection 42a-42b to each of the auxiliary voice coil sections of the pair. The main driving signal 41 may be a separate output from the voice coil controller 53 as illustrated in FIG. 2, or may also be split out from the same output as the auxiliary driving signal. Thereby the auxiliary voice coil sections 22a-22b may be driven as a pair, possibly different from the driving of the main voice coil section 21.

In the exemplary embodiment of the invention as shown in FIG. 2, the coupling of driving signals 41-42b may be performed by a voice coil controller 53. The voice coil controller 53 takes as input an audio signal 30, which is fed through an interface 52 adapted to receive the audio signal 30. The driving signals 41-42b may be derived from the audio signal 30, either directly or by means of processing, as described in more detail below. A main driving signal 41 may be continuously coupled to the main voice coil section 21 as long as an audio signal 30 is received, and the voice coil controller 53 selectively couples an auxiliary driving signal 42a-42b to the pair of auxiliary voice coil sections 22a-22b. The selective coupling of the auxiliary driving signal 42a-b to the pair of auxiliary voice coil sections 22a-b may be based on a comparison of a representation of excursion demand, i.e. the required excursion of the voice coil 1 to reproduce the audio signal 30 at any instant, with a representation of a predetermined excursion level, i.e. a level of excursion of the voice coil 1 where coupling of the auxiliary driving signal 42a-b is deemed necessary for the generation of electromotive force to reciprocate the voice coil 1. In practice, this comparison may include an analysis of the audio signal 30 performed by the voice coil controller 53 to determine whether a peak amplitude of the audio signal 30 is greater than a certain threshold for activation of the pair of auxiliary voice coil sections 22a-b. If an excursion range which can be generated by the main voice coil section 21 alone is required to reproduce the audio signal 30, the voice coil controller 53 may provide no auxiliary driving signal 42a-42b to the auxiliary voice coil sections 22a-22b. Instead, according to other embodiments of the invention, the voice coil controller 53 may provide an idle driving signal to the auxiliary voice sections 22a-22b. The idle driving signal may include a driving signal having a low signal strength, e.g. a low current, or a driving signal with no substantial current, for example no current.

Since the selective coupling of the auxiliary driving signal 42a-42b to the auxiliary voice coil sections 22a-22b is performed on pairs of voice coil sections, the requirements of the voice coil controller 53, which performs the selective coupling, may be significantly reduced compared to a system with a segmented voice coils, where a controller may have to perform selective couplings of driving signals to individual voice coil sections.

The voice coil sections 21-22b of the voice coil 1 can be configured in multiple ways, depending on the relative positioning and dimensioning of the voice coil sections 21-22b. In the illustrated embodiments, the voice coil 1 comprises three voice coil sections 21-22b, but the presently disclosed embodiments may be configured with various other numbers of voice coil sections and voice coil section geometries. For example, the number of voice coil sections may be increased to, for example, five voice coil sections (or more), e.g., one main voice coil section and two pairs of auxiliary voice coil sections, or even more. Selection of the number of voice coil sections may take into account a balancing between the resolution of power efficiency achieved and the additional complexity of manufacturing and controlling.

Referring to FIGS. 3a-d, the dynamic behavior of a voice coil 1 comprising three voice coil sections is illustrated according to embodiments of the invention.

FIG. 3a shows a voice coil 1 comprising a main voice coil section 21 and a pair of auxiliary voice coil sections 22a-22b, at an instant of time during application of an audio signal 30. Due to the applied audio signal 30, the electromotive force generated by a main driving signal 41 has slightly displaced the voice coil 1 in an upwards direction 5 along the travelling axis 4. To obtain this excursion, it is not necessary to couple an auxiliary driving signal 42a-42b to the pair of auxiliary voice coil sections 22a-22b, and such an auxiliary driving signal 42a-42b is therefore preferably not coupled to the auxiliary voice coil sections 22a-22b of the voice coil.

Figure 3B:
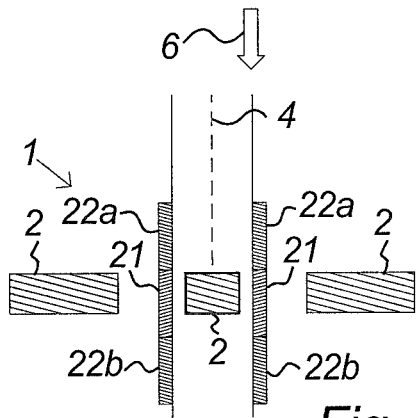

FIG. 3b shows the same voice coil 1 as in FIG. 3a in a later point in time of its reciprocating motion. Due to the applied signal 30, the electromotive force generated by the main driving signal 41 has slightly displaced the voice coil 1 in a downwards direction 6 along the travelling axis 4. The direction of the electromotive force is dependent on the direction of current in the windings of the voice coil sections, and the direction of current in the windings of the main voice coil section 21 has changed from FIG. 3a to FIG. 3b in order to translate the voice coil 1 along the opposite directions of travel 5-6. To obtain the excursion shown in FIG. 3b, it is still not necessary to couple an auxiliary driving signal 42a-42b to the auxiliary voice coil sections 22a-22b, and such an auxiliary driving signal 42a-42b is therefore preferably not coupled to the auxiliary voice coil sections 22a-22b of the voice coil 1.

Figure 3C:
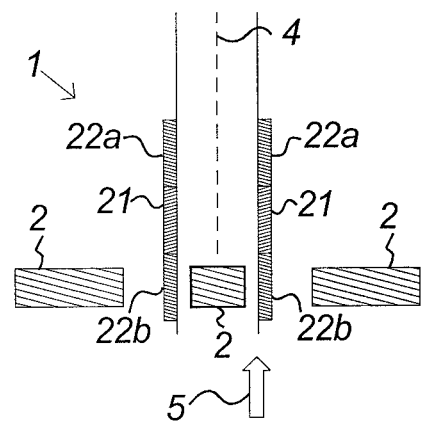

FIG. 3c illustrates a same direction of travel 5 of the voice coil 1 as shown in FIG. 3a, however the voice coil 1 is now translated more along the travelling axis 4. This is an example of a large excursion of the voice coil 1, since the main voice coil section 21 is now disposed entirely outside the air gap 3 of the magnetic circuit 2, and only one member 22b of the pair of auxiliary voice coil sections 22a-b is disposed partly within the air gap 3. To obtain this excursion of the voice coil 1, it may thus be necessary to couple an auxiliary driving signal 42a-b to the pair of auxiliary voice coil sections 22a-b.

Figure 3D:
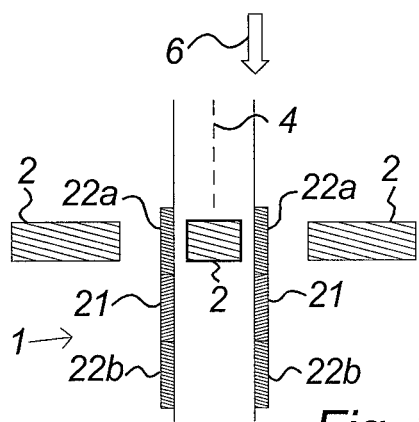

FIG. 3d illustrates a same direction of travel 6 of the voice coil 1 as shown in FIG. 3b, however the voice coil 1 is now translated more along the travelling axis 4. This is an example of a large excursion of the voice coil 1, since the main voice coil section 21 is now disposed entirely outside the air gap 3 of the magnetic circuit 2, and only one member 22a of the pair of auxiliary voice coil sections 22a-b is disposed partly within the air gap 3. To obtain this excursion of the voice coil 1, it may thus be necessary to couple an auxiliary driving signal 42a-b to the pair of auxiliary voice coil sections 22a-b.

Figure 4:
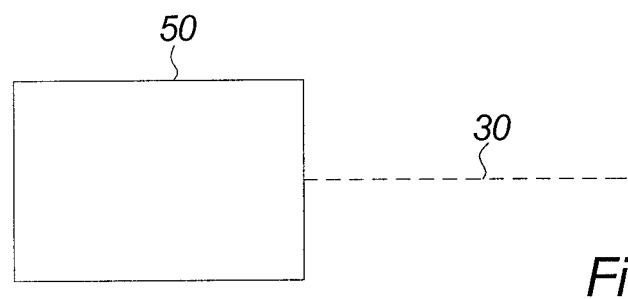
FIG. 4 illustrates a loudspeaker receiving an audio signal according to an embodiment the invention.

FIG. 4 illustrates a loudspeaker 50 receiving an audio signal 30. The loudspeaker may receive the audio signal 30 using an interface 52 (not shown). The loudspeaker comprises one or more of the voice coil driving systems 51 described herein. When receiving an audio signal 30 the loudspeaker reproduces the audio signal 30 and an acoustic signal is generated by reciprocation of one or more loudspeaker diaphragm 7 (not shown) which in return generates pressure waves, i.e. sound waves. The diaphragm 7 of each voice coil driving system 51 of the loudspeaker 50 is reciprocated by a voice coil 1 controlled according to embodiments of the invention as described herein.

Figure 5A:
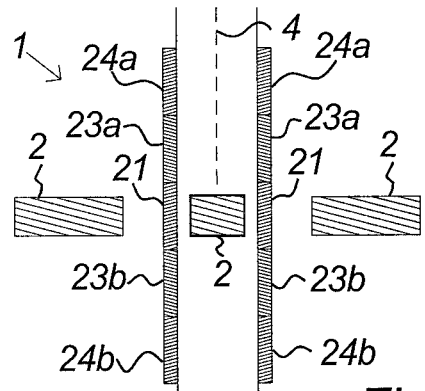
FIGS. 5a-5c illustrate various alternative embodiments of the invention, specifically an embodiment comprising five voice coil sections, an embodiment with an excursion sensor system, and an embodiment where the individual voice coil sections are underhung.
Figure 5B:
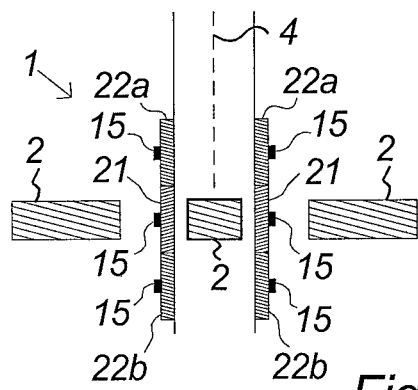
Figure 5C:
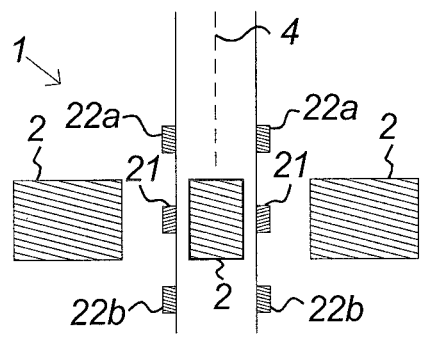

Referring to FIGS. 5a-c, alternative voice coil geometries are shown according to embodiments of the invention.

FIG. 5a illustrates a voice coil 1 comprising five voice coil sections; a main voice coil section 21, a first pair of auxiliary voice coil sections 23a-b, and a second pair of auxiliary voice coil sections 24a-b. The five voice coil sections may be mechanically coupled, and in some cases may be electrically coupled, to form the voice coil 1. The mechanical coupling may comprise a support such as a tube, mesh or wire structure of paperboard, plastic or metal, e.g. a foil.

The main voice coil section 21 is powered by a main driving signal 41, whereas the first pair of auxiliary voice coil sections 23a-b is powered by a first auxiliary driving signal and the second pair of auxiliary voice coil sections 24a-b are powered by a second auxiliary driving signal. In FIG. 5a, the voice coil 1 is centrally aligned with the air gap 3 of the magnetic circuit 2 with the main voice coil section 21 partially disposed within the air gap 3. Including further voice coil sections compared to the voice coil 1 of FIGS. 3a-3d may have the further advantage that greater excursions of the voice coil 1 may be achieved, given that the individual voice coil sections are of similar height and density of windings (i.e. windings per length of the voice coil section as measured in a direction along the travelling axis 4).

All discussion relating to a voice coil comprising three voice coil sections, i.e. a main voice coil section 21 and a pair of auxiliary voice coil sections 22a-b is equally applicable to a voice coil comprising further pairs of voice coil sections, such as two or more pairs of auxiliary voice coil sections.

In other embodiments of the invention, the voice coil 1 may comprise even further pairs of auxiliary voice coil sections, which are powered by further corresponding auxiliary driving signals.

FIG. 5b illustrates a voice coil 1 comprising three voice coil sections; a main voice coil section 21 and a pair of auxiliary voice coil sections 22a-b. The voice coil sections include a sensor system comprising one or more excursion measurement units 15. In this example is shown three excursion units 15, in the form of excursion measurement coils that are arranged to establish a position of the voice coil in relation to the air gap 3. These excursion measurement coils 15 are small coils/windings positioned on the voice coil, and when the voice coil reciprocates in the air gap 3, a measurement current is induced in the coils due to a time-dependent change in the magnetic field as experienced by the measurement coils 15. Thus, by measuring induced currents in each of the excursion measurement coils 15, it may be possible to establish the displacement/excursion of the voice coil 1 and appropriate driving signals may be coupled on the basis of this established excursion. In other embodiments of the invention, any other number of excursion measurement units 15 may be used, and these may establish the position of the voice coil using different means, such as optical means, e.g. by performing measurements using a laser.

FIG. 5c illustrates a voice coil 1 comprising a main voice coil section 21 and a pair of auxiliary voice coil sections 22a-b. Each of the voice coil sections has a height which is smaller than the height of the air gap 3. Such voice coils may be referred to as underhung voice coil sections, whereas voice coil sections shown in any of FIGS. 3a-3d may be referred to as overhung voice coil sections since the height of the voice coil sections exceeds the height of the air gap 3 of the magnetic circuit 2.

Figure 6A:
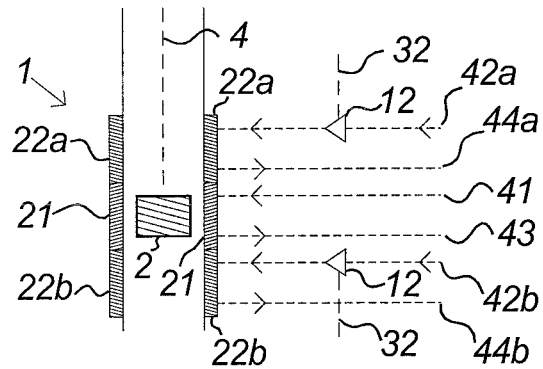
FIGS. 6a-6c illustrate various configurations for providing a main driving signal and auxiliary driving signals to voice coil sections according to embodiments of the invention.
Figure 6B:
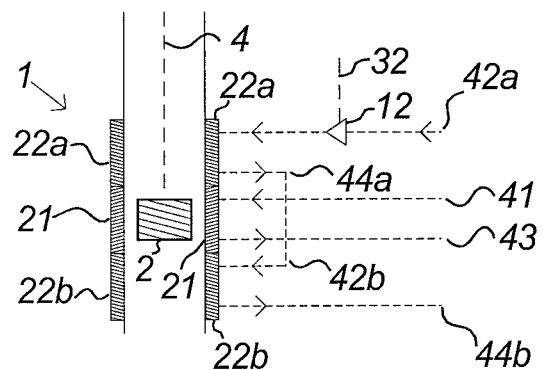
Figure 6C:
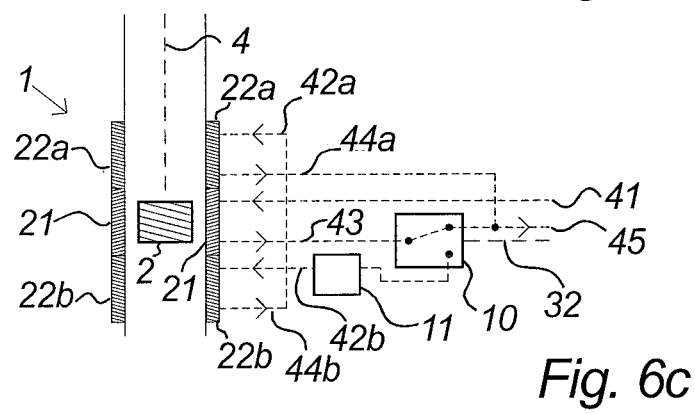

FIGS. 6a-c illustrate examples of ways of providing driving signals to the main voice coil section and the pair of auxiliary voice coil sections.

FIGS. 6a-c each illustrate a voice coil 1 comprising a main voice coil section 21 and a pair of auxiliary voice coil sections 22a-22b, both current input and output channels of the different voice coil sections are shown. In each subfigure of FIGS. 6a-6c, the auxiliary driving signal is provided through different exemplary approaches.

Referring to FIG. 6a, a main driving signal 41 is provided to the main voice coil section 21, and the current of the signal may leave the voice coil 1 by a channel 43. The selective coupling of an auxiliary driving signal 42a-42b to auxiliary voice coil sections 22a-22b may be controlled by two amplifiers 12. Control signals 32 connected to the two amplifiers 22a-22b may control whether the input signals of the amplifiers 12 are amplified to perform the coupling, or whether the input signals are not amplified to not perform the coupling. Current of the auxiliary driving signal 42a provided to the auxiliary voice coil section 22a may leave though an output channel 44a, and current of the auxiliary driving signal 42b provided to the auxiliary voice coil section 22b may leave though an output channel 44b.

Referring to FIG. 6b, a main driving signal 41 is provided to the main voice coil section 21, and the current of the signal may leave the voice coil 1 by a channel 43. The selective coupling of an auxiliary driving signal 42a-42b to auxiliary voice coil sections 22a-22b may be controlled by one amplifier 12. A control signal 32 connected to the amplifier 12 may control whether the input signal of the amplifier is amplified to perform the coupling, or whether the input signal is not amplified to not perform the coupling. Current of the auxiliary driving signal 42a provided to the auxiliary voice coil section 22a may leave though an output channel 44a to be used again as an input auxiliary signal 42b to the auxiliary voice coil section 22b, and thereafter finally leave the voice coil 1 though output channel 44b.

Referring to FIG. 6c, a main driving signal 41 is provided to the main voice coil section 21, and current of that signal may leave the voice coil section 21 by a channel 43. A switching unit 10 controlled by a control signal 32 may either pass this current to be coupled as an auxiliary driving signal 42a-42b to the auxiliary voice coil sections 22a-22b or allow this current to leave the voice coil 1. The control signal 32 and the switching unit 10 thus may perform the selective coupling of an auxiliary driving signal to a pair of auxiliary voice coil sections. In some embodiments, the output current 43 may require modification to be utilized as an auxiliary driving signal, and such a modification may be performed by implementing an optional amplification or damping element 11. After this optional element, the auxiliary driving signal 42b may be provided to an auxiliary voice coil section 22b. Then, the current of the signal leaves the auxiliary voice coil section 22b through output channel 44b, and this current may be used as an auxiliary driving signal 42a for the other auxiliary voice coil section 22a. Finally, the current of the signal leavers the voice coil section 22a though output channel 44a and leaves the voice coil though channel 45.

The disclosed methods for providing a main driving signal and an auxiliary driving signal are not limited to the above described exemplary embodiments.

Figure 7A:
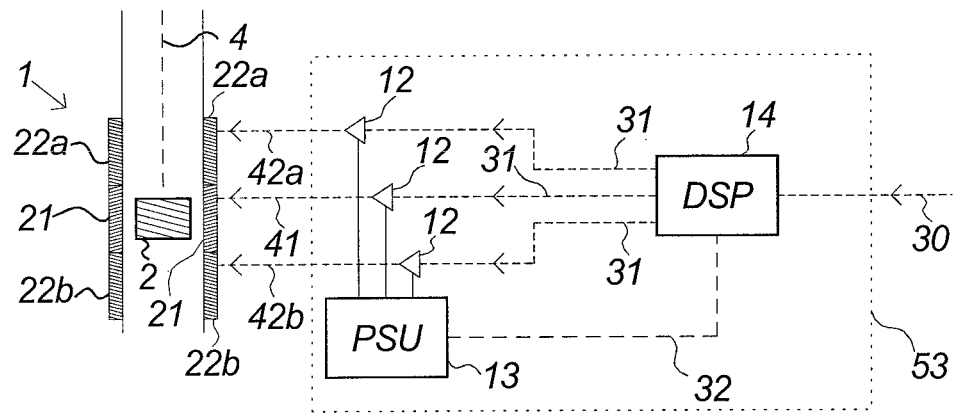
FIGS. 7a-7b illustrate various configurations of a controller adapted to couple a driving signal to the plurality of voice coil sections based on an input audio signal according to various embodiments of the invention.
Figure 7B:
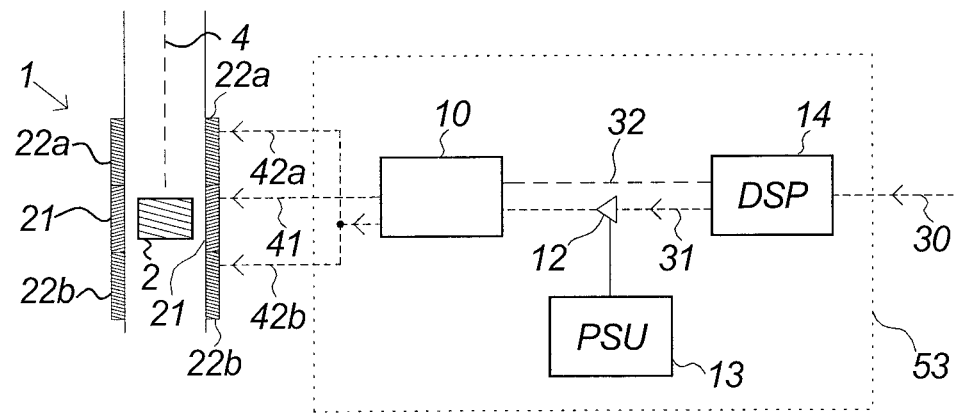

Referring to FIGS. 7a-b, configurations of a controller adapted to couple driving signals to voice coil sections according to some embodiments of the invention are shown.

In some embodiments, a main driving signal 41 may be continuously coupled to a main voice coil section 21, and an auxiliary driving signal 42a-b may be selectively coupled to a pair of auxiliary voice coil sections 22a-b. This may be performed by a voice coil controller 53, which may comprise one or more switching units, amplifiers, power supply units, and/or a signal processor, e.g. a digital signal processor.

FIG. 7a shows an exemplary embodiment of the invention, where the voice coil 1 is controlled by a voice coil controller 53. A digital signal processor 14 provides a control signal 32 to a power supply unit 13. The control signal 32 generated by the digital signal processor 14 may be based on e.g. the audio signal 30. The digital signal processer 30 may also perform modifications to the audio signal 30 to create a processed audio signal 31. Such modifications may include delaying the audio signal. The power supply unit 13 may continuously power one amplifier which is able to generate a main driving signal 41 based on a processed audio signal 31. Moreover, the power supply unit 13 may power two additional amplifiers based on the control signal 32, and thus perform the selective coupling of auxiliary driving signals 42a-b to auxiliary voice coil sections 22a-b.

FIG. 7b shows another exemplary embodiment of the invention, where the voice coil 1 is controlled by a voice coil controller 53. Here, a digital signal processer generates a control signal 32 and a processed audio signal 31, both based on audio signal 30. A power supply unit 13 powers an amplifier 12, which amplifies the processed audio signal 31 to generate a driving signal which is sent to a switching unit 10. The switching unit 10 is controlled by the digital signal processor 14 through the control signal 32, and is able to continuously provide a main driving signal 41 to the main voice coil section 21, whereas it selectively couples an auxiliary driving signal 42a-42b to the auxiliary voice coil sections 22a-22b.

Voice coil controller configurations are not limited to the examples described above. Various arrangements of signal processors, amplifiers, switching units, power supply units, and/or other electrical components, may be used to perform the task of selectively coupling an auxiliary driving signal to auxiliary voice coil sections, while coupling a main driving signal to a main voice coil section.

Figure 8:
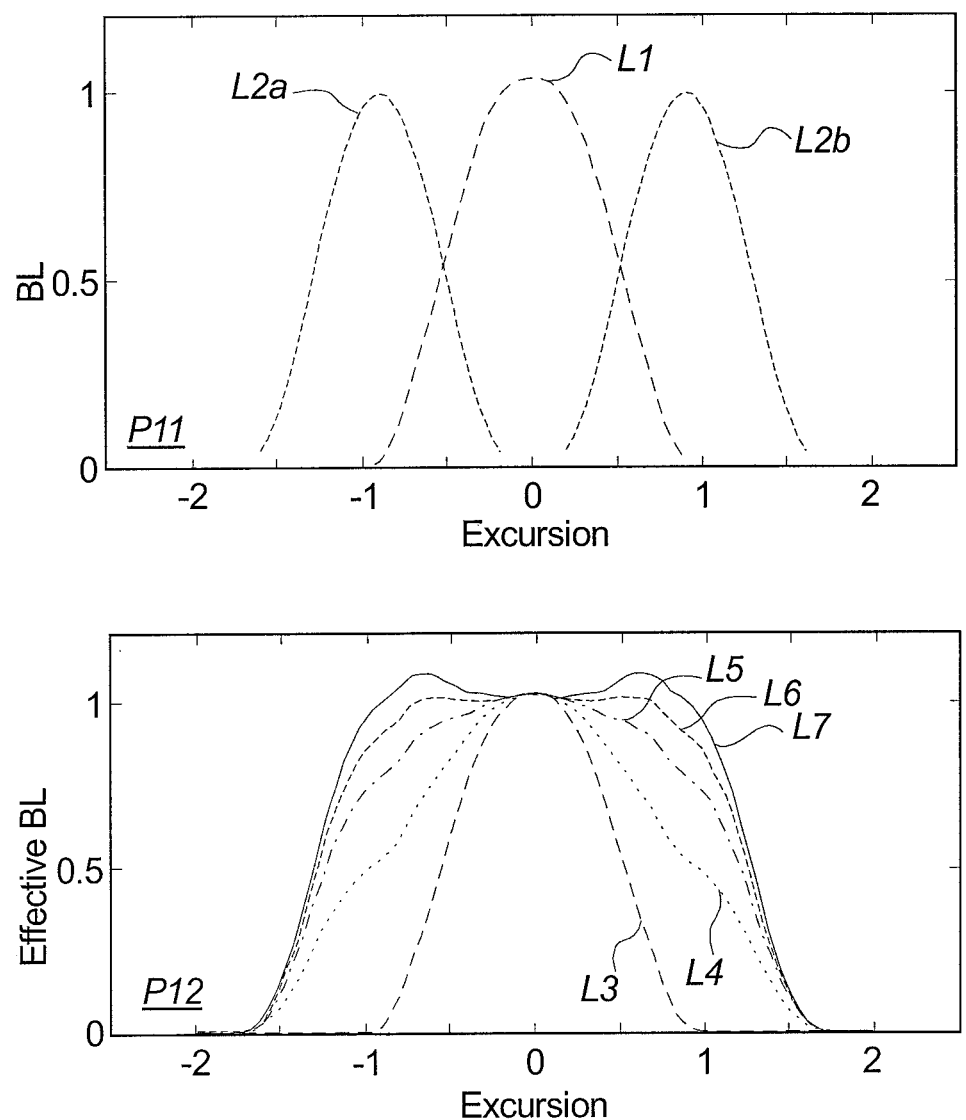
FIG. 8 illustrates the capability of the voice coil sections to generate an electromotive force according to various embodiments of the invention.

FIG. 8 illustrates capabilities of the different voice coil sections of the voice coil to generate an electromotive force.

The magnitude of an electromotive force generated on a voice coil by running a current through the voice coil in a magnetic field may depend on the total length of current-carrying wire within the magnetic field and the strength of the magnetic field. The product of the length of wire within the magnetic field and the magnitude of the magnetic field may thus describe the capability of a voice coil, or a voice coil section, to generate an electromotive force, and may be referred to as BL. This parameter may vary with the voice coil excursion, e.g. since current-carrying wire may leave or enter a magnetic field region.

Referring to chart P11 of FIG. 8, the BL contribution from individual voice coil sections for an exemplary embodiment of the invention with three voice coil sections is shown for a range of excursions. The curve L1 shows the BL contribution from a main voice coil section, which is largest when the excursion is 0, and decreases gradually if the excursion is increased or decreased away 0, e.g., as the main voice coil section is moved out of the air gap, its capability to generate a electromotive force is gradually reduced. The curves L2a and L2b describe the BL contribution from two auxiliary voice coil sections, respectively. If the excursion is decreased below 0, curve L2a shows that the capability of one auxiliary voice coil section to generate an electromotive force is increased, and if the excursion is increased above 0, curve L2b shows that the capability of the other auxiliary voice coil section is increased. Chart P11 thus illustrates how auxiliary voice coil sections may support a main voice coil section, depending on excursion demand.

Referring to chart P12 of FIG. 8, an effective BL is shown for a similar exemplary embodiment. The effective BL may be understood as a sum of BL contributions from a main voice coil section and auxiliary voice coil sections, where the BL contribution from auxiliary voice coil sections has been multiplied by a gain factor. The curves L3-L7 correspond to gain factors from 0% to 100%. For a gain of 0%, displayed by curve L3, only the main voice coil section may contribute to the generation of an electromotive force. As the gain is increased, so is the width and height of the effective BL curves along the excursion axis.

In various embodiments of the invention, an effective BL curve which is approximately constant across a broad range of excursions may be ideal. In the displayed exemplary embodiment, this condition may be obtained with a gain of 90% as shown by the curve L6, which has an effective BL which is flat in a range of excursion from −0.6 to 0.6. In other various embodiments, it may be preferable for a BL curve not to be flat, e.g. the effective BL may increase as the excursion is increased or decreased. This condition may be obtained by a gain of 100% as shown by the curve L7, where the effective BL is larger at excursions of −0.7 and 0.7 than at an excursion of 0. This may allow corrections of nonlinearities in the voice coil system, e.g. a nonlinear relation between the restoring force acting on the voice coil and the excursion of the voice coil, which may introduce distortions at large voice coil excursions.

The above described exemplary embodiment shown in FIG. 8 illustrates how auxiliary voice coil sections may support a main voice coil section, and how various gains may be advantageous depending on target application. Other embodiments of the invention may have other effective BL curves, depending on number of voice coil sections, winding density, magnetic field geometry, auxiliary driving signal gain etc.

Figure 9A:
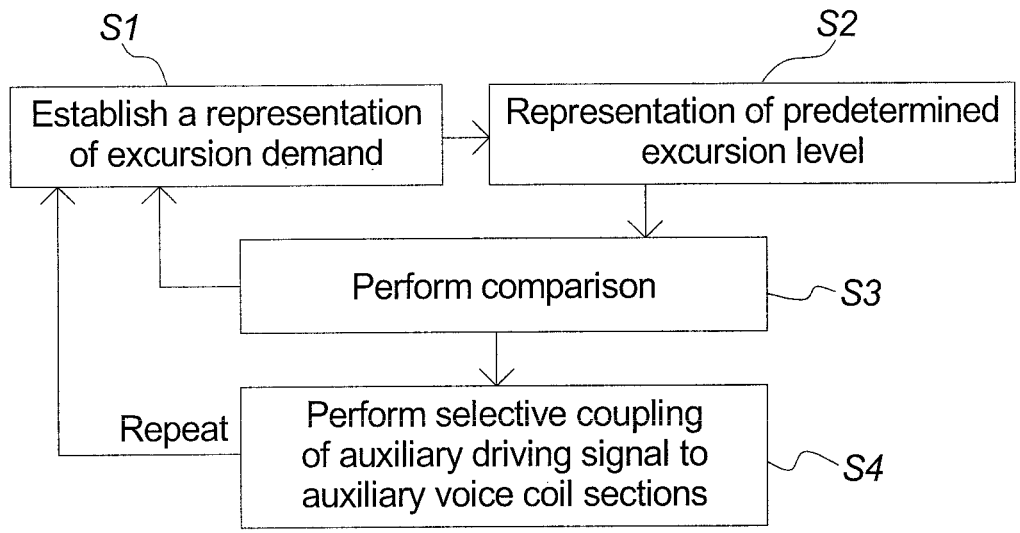
FIGS. 9a-9b illustrate flow charts of methods of coupling driving signals to pairs of auxiliary voice coil sections according to embodiments of the invention.
Figure 9B:
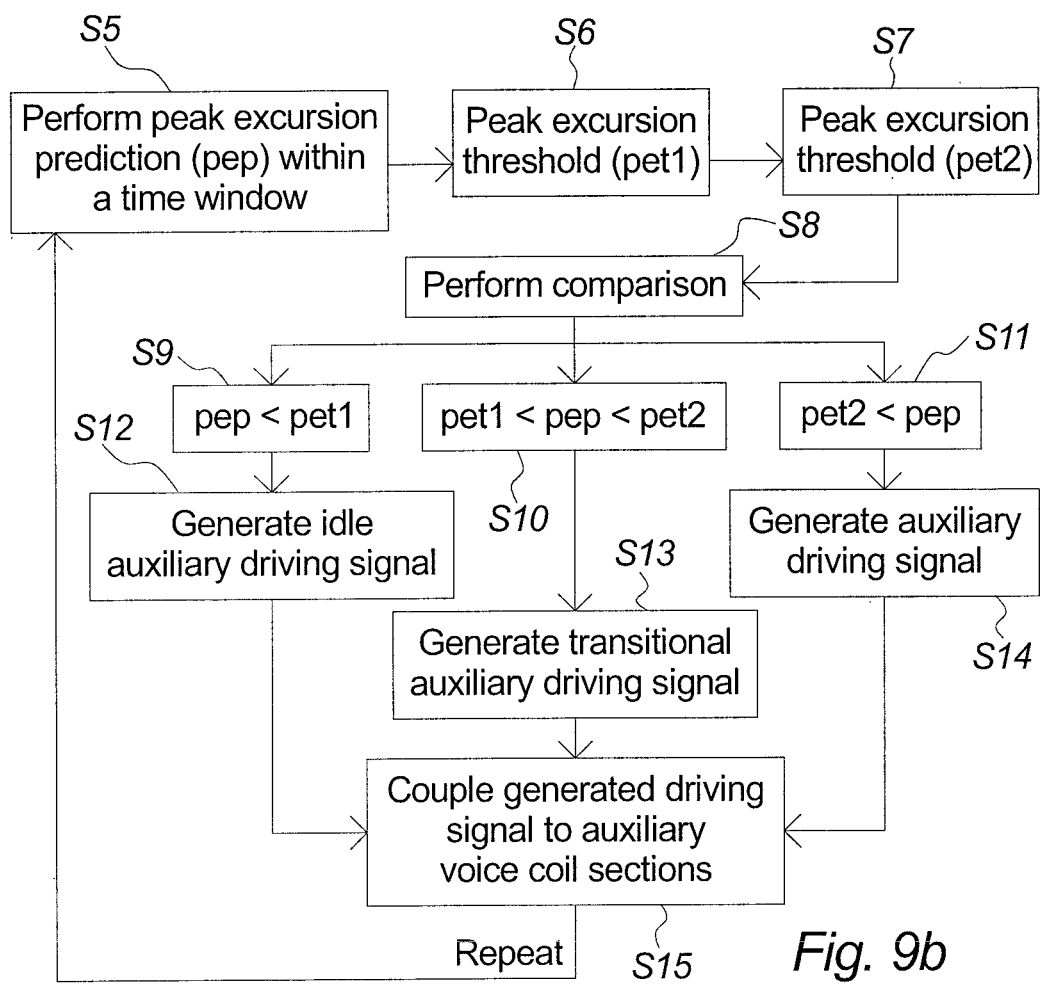

FIGS. 9a-b illustrate flow charts of methods of coupling driving signals to a pair of auxiliary voice coil sections according to embodiments of the invention.

The flow chart of FIG. 9a illustrates steps S1-S4 of a method of performing selective coupling of an auxiliary driving signal 42 to a pair of auxiliary voice coil sections 22a-b. One or more of the method steps S1-S4 may be performed by a voice coil controller 53. In a step S1, a representation of excursion demand is established, and in a step S2 a representation of a predetermined excursion level is provided. In a step S3, a comparison between excursion demand and predetermined excursion level is performed. If predetermined conditions are not met, e.g. the excursion demand does not exceed a predetermined excursion level, the method may return to step S1. If, however, the comparison reveals that the predetermined condition is met, the method proceeds with step S4 in which an auxiliary driving signal is applied to a pair of auxiliary voice coil sections. The method may then return to step S1.

The flow chart of FIG. 9b illustrates steps S5-S15 of a method of performing selective coupling of driving signals to a pair of auxiliary voice coil sections 22a-b. The method steps S5-S15 may be performed by a voice coil controller 53. In a step S5, a prediction (pep) of excursion demand is performed by using signal analysis. In steps S6 and S7 a first peak excursion threshold (pet1) and a second peak excursion threshold (pet 2) are provided. In a step S8, the prediction (pep) of excursion demand is compared with the provided first (pet1) and second (pet2) peak excursion thresholds.

If, in a step S9, it is determined that pep is less than pet1, only an idle auxiliary driving signal is generated in step S12. If, however, the comparison reveals, in a step S10, that pep is in between the two values pet1 and pet2, a transitional auxiliary driving signal may be generated in step S13. It is understood that an idle auxiliary driving signal may also be generated. If the comparison reveals, in a step S11 that pep is greater than pet2, a full auxiliary driving signal may be generated in step S14. A full auxiliary driving signal may include a sum of an idle auxiliary driving signal and a transitional auxiliary driving signal which is at its maximum. The generated driving signals may be coupled to the pair of auxiliary voice coil sections in a step S15, and then the method may be repeated beginning again with step S5.

Referring to FIGS. 10a-d, various current directions in individual voice coil sections at selected instances of time during operation are illustrated.

A driving signal for driving a voice coil may include current flow alternating between two opposite directions of current. The main driving signal and the auxiliary driving signal may include current flowing in the same azimuthal direction around said the travelling axis 4 of the voice coil 1. The azimuthal direction may include the angular direction around an axis, e.g. the travelling axis. An azimuthal direction may thus be a clockwise direction 60 around the travelling axis 4, or an anticlockwise direction 61 around the travelling axis 4. Preferably, the direction of current should thus be synchronized among the voice coils, e.g. at a given instance of time, there should not be current flow in a clockwise direction 60 in one voice coil section while there is current flow in an anticlockwise direction 61 in another. According to the invention, it may be preferable at some instances of time, that no substantial current flows in auxiliary voice coil sections 22a-22b, while current flows in the main voice coil section 21.

Figure 10A:
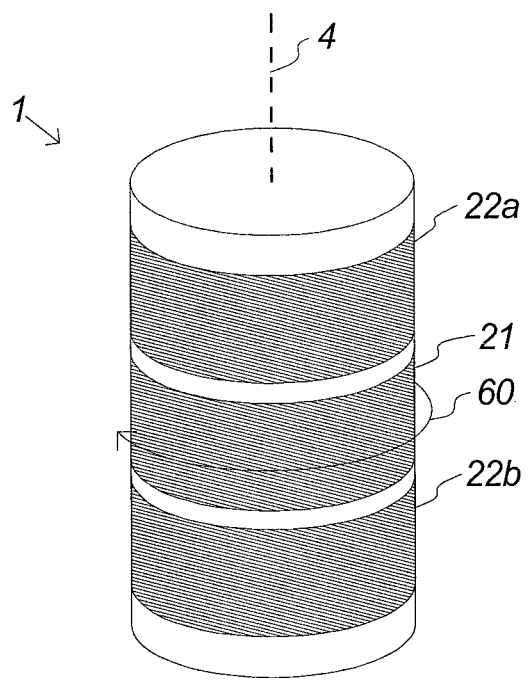
FIGS. 10a-10d illustrate current directions in individual voice coil sections during operation of an exemplary preferred embodiment of the invention.
Figure 10B:
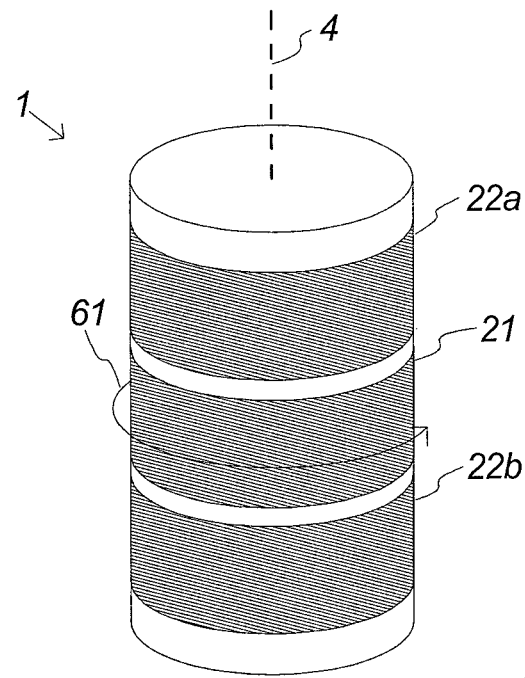

A main driving signal may be continuously coupled to a main voice coil section 21, whereas an auxiliary driving signal may be selectively coupled to auxiliary voice coil sections 22a-22b. In various embodiments, when an auxiliary driving signal is not selectively coupled, current will thus mainly flow in the main voice coil section 21. At some instances of time it will flow clockwise 60 around the travelling axis 4 as shown in FIG. 10a, and at some other instances of time it will flow anticlockwise 61 around the travelling axis 4 as shown in FIG. 10b. Preferably there is no current in an anticlockwise direction 61 in auxiliary voice coil sections 22a-22b when there is current in a clockwise direction 60 in the main voice coil section 21, and similarly no current in a clockwise direction 60 in auxiliary voice coil sections 22a-22b when there is current in an anticlockwise direction 61 in the main voice coil section 21.

Figure 10C:
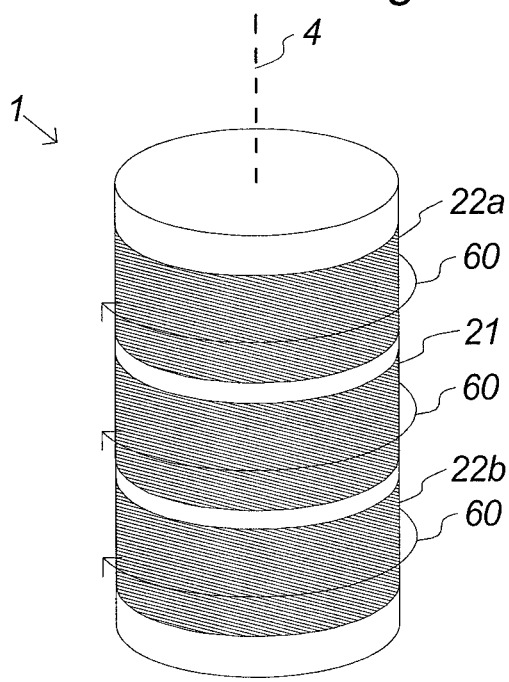
Figure 10D:
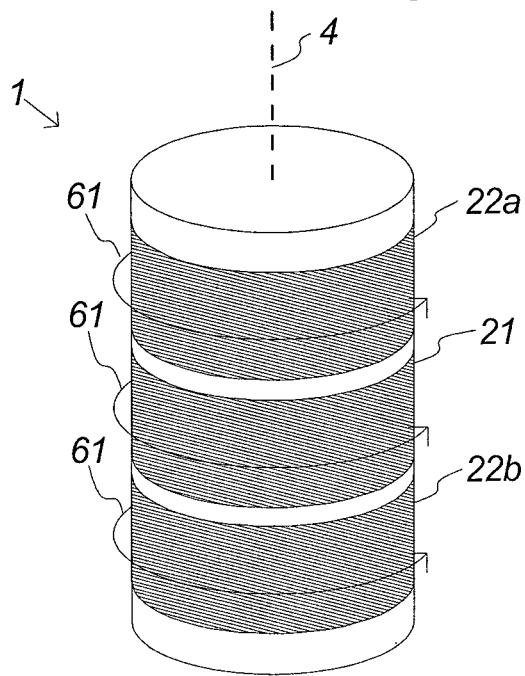

When instead an auxiliary driving signal is coupled, the current flow direction in any voice coil section at a given instance of time is the same, i.e. either the current flows in the main voice coil section 21 and in the auxiliary voice coil sections 22a-22b is clockwise 60 as shown in FIG. 10c or anticlockwise 61 as shown in FIG. 10d.

In other embodiments of the invention, an idle auxiliary driving signal and/or a transitional auxiliary driving signal is coupled to auxiliary voice coil sections 22a-22b when a full auxiliary driving signal is not required, and in these embodiments, the current flows in the auxiliary voice coil sections are in the same direction of current flow as the current flow in the main voice section. In these various embodiments, the current flow direction in any voice coil section at a given instance of time is the same, i.e. either the current flow in the main voice coil section 21 and in the auxiliary voice coil sections 22a-22b is clockwise 60 as shown in FIG. 10c or anticlockwise 61 as shown in FIG. 10d.

FIG. 10a-10d display exemplary illustrations, and the current flow according to the invention is not limited to these examples. In other various embodiments, a voice coil 1 is segmented into five voice coil sections, where, at any instance of time, current flowing in any of the voice coil section may be in the same azimuthal direction around a travelling axis. In other various embodiments, an upper and a lower rectified driving signal is provided to an upper and a lower voice coil section arranged respectively on either side of the main voice coil section, where substantial current may only flow in the main voice coil section and either the upper or the lower voice coil section.

Figure 11:
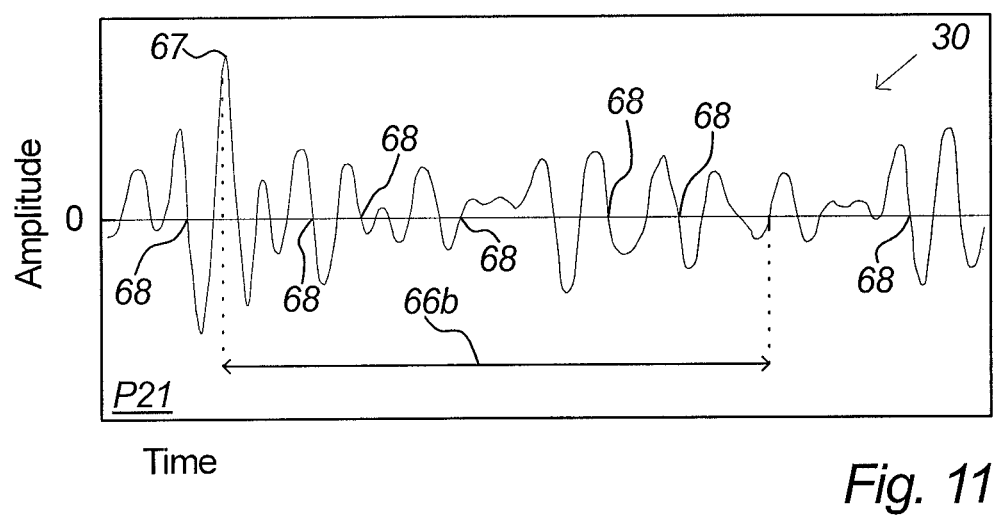
FIG. 11 illustrates an exemplary determination of selective coupling time based on zero crossings of an audio signal according to embodiments of the invention.

FIG. 11 shows an illustration P21 of an audio signal 30 which is a time-domain illustration of the amplitude of the audio signal 30, i.e. the illustration shows the amplitude of the audio signal 30 as a function of time. As illustrated, the audio signal 30 alternates two either side of a zero-point in the amplitude. As illustrated in FIG. 11, the audio signal 30 comprises multiple peaks, for example a significant audio signal peak 67, as well as multiple zero-crossings 68. The zero-crossings 68 are points in time along the audio signal 30 in which the amplitude is zero. The audio signal peak 67 may represent a point in the audio signal 30 which reproduction requires the use of not only the main voice coil section 21 of the voice coil 1, but also the use of a pair of auxiliary voice coil sections 22a-b of the voice coil 1. In other words, the peak 67 requires a selective coupling of a pair of auxiliary voice coil sections. The selective coupling of the pair of auxiliary voice coil sections 22a-b is maintained for an extended time duration after the peak 67. Such an extended coupling of an auxiliary driving signal after the presence of an audio signal peak 67 may also be referred to as peak-hold or peak-lock. The coupling of the auxiliary driving signal is maintained during a peak-lock time window 66b which extends from the peak 67 and for a certain duration thereafter. In this example, the peak-lock time window 66b has a time duration including twenty zero crossings 68 of the audio signal. However, in other embodiments of the invention, the time window 66b may comprise any number of zero-crossings 68, such as tenths of zero crossings, hundreds of zero-crossings or even thousands of zero-crossings.

Figure 12A:
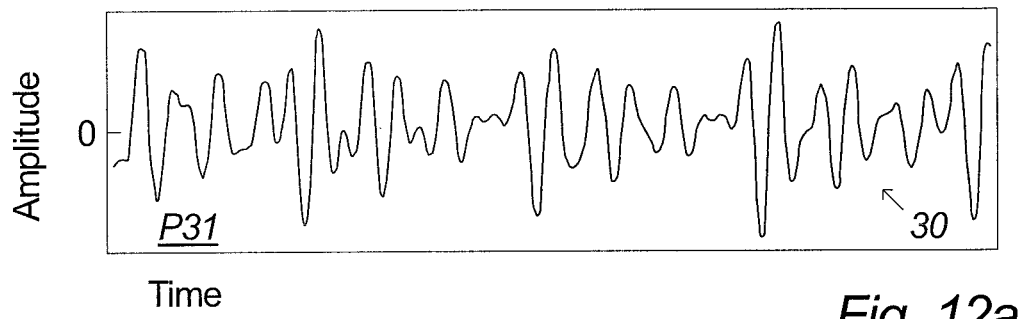
FIGS. 12a-c illustrates different methods of determining an excursion demand on the basis of an audio signal according to embodiments of the invention.
Figure 12B:
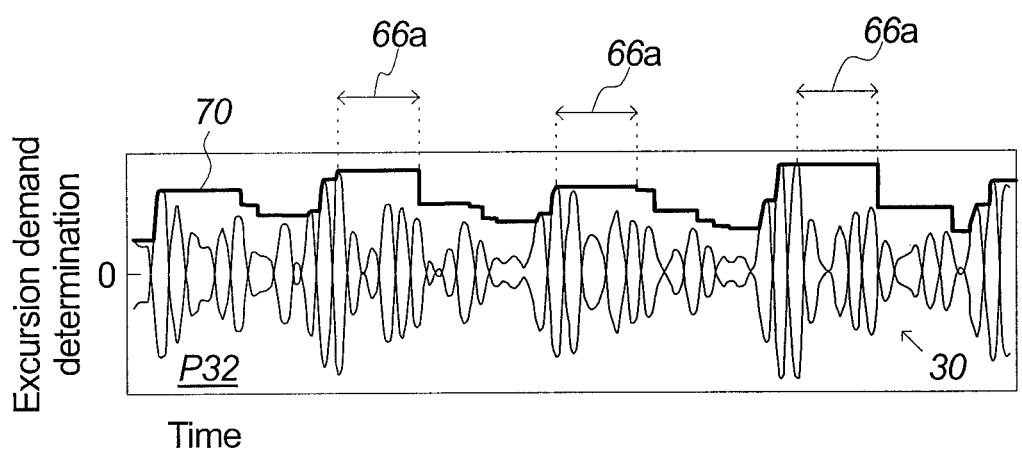
Figure 12C:
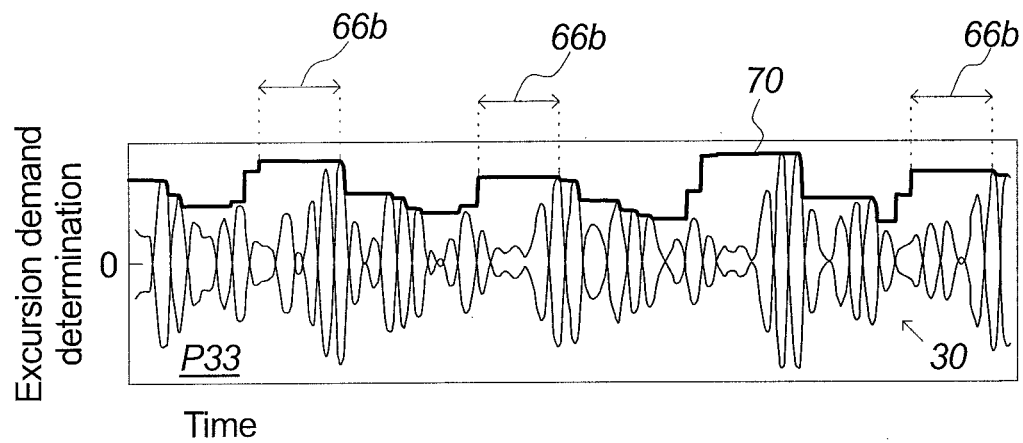

FIGS. 12a-c illustrates various techniques for determining an excursion demand 70 on the basis of an audio signal 30.

FIG. 12a shows an illustration P31 of an audio signal 30 which is a time-domain illustration of the amplitude of the audio signal 30, i.e. the illustration shows the amplitude of the audio signal 30 as a function of time. As illustrated, the audio signal 30 alternates two either side of a zero-point in the amplitude.

The audio signal 30 is received in a voice coil controller 53 (not shown on FIG. 12) which performs a signal analysis on the audio signal 30. This analysis comprises an analysis of the peaks or spikes in the audio signal. On the basis of this analysis, the voice coil controller 53 determines an excursion demand, i.e. the voice coil controller establishes, on basis of the audio signal, how much the voice coil 1 (not shown on FIG. 12) has to translate from its resting/equilibrium position at various points in time in the audio signal 30 to accurately reproduce the audio signal 30.

FIG. 12b shows an illustration P32 which is a representation of excursion demand 70 determined by the voice coil controller 53 on the basis of the audio signal 30. The representation of excursion demand 70 as seen in panel FIG. 12b is not identical to the excursions as seen in the audio signal 30 (also shown in FIG. 12b). The excursion demand does not follow the changes in amplitude of the audio signal 30 due to a preference of maintaining auxiliary driving signals for an extended period of time, e.g. a time period of several zero crossings. This is advantageous in that fewer distortions in time may be present in the reproduced audio signal in comparison with an auxiliary driving signal which is coupled for a time duration comparable to a typical period of oscillation of the voice coil. Even small errors in the switching point when coupling an auxiliary driving signal in and out one or more times during each oscillation, will lead to significant distortion as the switching is happening at the same frequency as the driving signal.

The excursion demand 70 shown in FIG. 12b is determined by a voice coil controller 53 on the basis of a signal analysis. This signal analysis determines high amplitude peaks/spikes in the audio signal 30 and applies a peak-lock time window 66a after such a peak, also referred as peak-hold. The peak-lock time window 66a is a time duration for which the excursion demand 70 is fixed at a level set by the amplitude of the peak. As seen in the figure, the excursion demand 70 roughly follows an envelope of the audio signal until an audio signal peak 67 is present in the audio signal. From this point on, the excursion demand 70 is maintained at a constant level for an amount of time given by the peak-lock time window 66a.

Alternative to the embodiment shown in FIG. 12b, the excursion demand 70 may also be determined using a look-ahead time delay, as shown in the embodiment of FIG. 12c.

FIG. 12c shows an illustration P33 which is a representation of excursion demand 70 determined/predicted by the voice coil controller 53 on the basis of the audio signal 30. In this embodiment of the invention, the driving signals, i.e. the main driving signal 41 and the auxiliary driving signal 42a-b, are coupled to the respective voice coil sections with a time delay with respect to reception of the audio signal. In practice, this means that the voice coil controller 53 may perform signal analysis on a part of the audio signal 30, having a duration up to the duration of the time delay, before applying the driving signals. The duration of this part of the signal is referred to as a look-ahead time window 66b in this example. Clearly, the look-ahead time window 66b is not a static time window, but a time window which follows the progression of the audio signal with a speed equal to the speed of the reproduced audio signal. In other words, the time window is a window which may always be ahead of the audio signal, as reproduced, by a time given by the look-ahead time window 66b.

The look-ahead time windows 66b as shown in FIG. 12c each contain one or more high amplitude peaks 67, or spikes, of the audio signal 30 and the voice coil controller 53 may establish the greatest peak within the time window. The highest peak may be used to determine the highest excursion demand within the time window 66b. In this embodiment, the excursion demand is set to a constant level up to this highest peak, and in this sense, the voice coil 1 may be prepared to reproduce this peak since the excursion demand 70 is already set at the necessary value before the point in time at which the peak arises. This has the consequence that current flows in auxiliary voice coil sections prior to the presence of the current being strictly necessary, and thus many unnecessary couplings in and out of driving signals may be avoided within the look-ahead time window 66b. According to other embodiments of the invention, the excursion demand is gradually increased up to the highest excursion demand within the look-ahead time window 66b, and this demand is accounted for by providing a transitional auxiliary driving signal to the auxiliary voice coil sections. A transitional auxiliary driving signal allows for a gradual increase of the current in the auxiliary voice coil sections to reproduce such a gradual increase, or gradual decrease, in the excursion demand.

Figure 13:
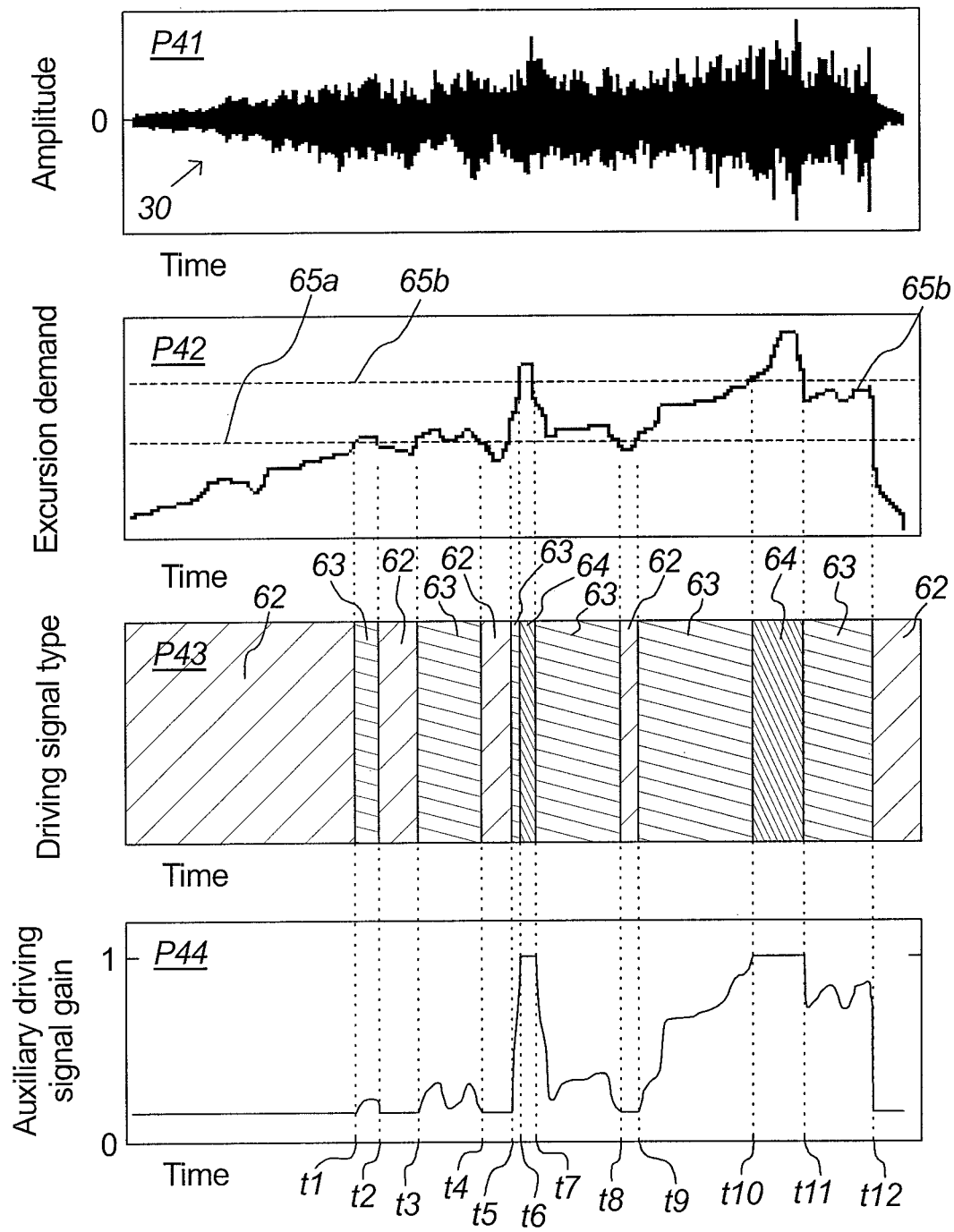
FIG. 13 illustrates an exemplary method for determining an auxiliary driving signal gain according to embodiments of the invention.

FIG. 13 illustrates aspects of a method of determining a gain of an auxiliary driving signal according to embodiments of the invention.

Shown in FIG. 13 is an illustration P41 of an audio signal 30 which is a time-domain illustration of the amplitude of the audio signal 30, i.e. the illustration shows the amplitude of the audio signal 30 as a function of time. The audio signal 30 serves as an input signal to a voice coil controller 53, and by using signal analysis on the audio signal 53, the voice coil controller provides driving signals to voice coil sections of the voice coil 1. Using a signal analysis based on a look-ahead time window 66b as described in relation to FIG. 12c, a representation of excursion demand is determined by the voice coil controller 53. The determination of excursion demand 70 is thus made with a head-start in relation to the audio signal due to a time delay between reception of the audio signal 30 and the reproduction of the audio signal. The excursion demand 70 determined by the voice coil controller 53 on the basis of the audio signal 30 is shown in illustration P42 of FIG. 13. As seen, the excursion demand follows a smoothed version of the envelope of the audio signal 30 as seen in illustration P41, with excursion demands that are somehow maintained for a short duration prior to a high peak in the audio signal 30.

Also shown in the illustration P42 are two representations of predetermined excursion levels 65a-65b. The predetermined excursion levels are preselected values of excursion which trigger couplings of auxiliary driving signals, and thus the voice coil controller 53 compares the excursion demand 70 determined on the basis of the audio signal 30, with the predetermined excursion levels 65a-65b, and perform couplings of driving signals on the basis of this comparison. These couplings are shown in greater detail in illustration P43 which shares a common time axis with illustrations P41 and P42.

Looking at illustration P42 there is first a time period of the audio signal in which excursion demand curve 70 does not exceed the lower predetermined excursion level 65a. In this time period, also referred to as an idle auxiliary driving signal period 62, only an idle auxiliary driving signal is applied to the pair of auxiliary voice coil sections 22a-b. The idle auxiliary driving signal is a driving signal with a reduced signal strength. In this example, the idle auxiliary driving signal has an amplitude which is 10% of the amplitude, or a gain of 0.1, of the corresponding main driving signal 41 which is always continuously coupled to the main voice coil section 21 for as long as an audio signal 30 is supplied. In other embodiments of the invention the gain or amplitude of the idle auxiliary driving signal is a different value, such as a value between 10% and 100% or a value between 0% and 10%, with 0% being identical to a null signal.

One purpose of the idle auxiliary driving signal is to maintain a small driving current in the pair of auxiliary voice coil sections 22a-b even though that current is not needed for the generation of electromotive force driving the voice coil 1. This may prevent back EMF braking of the voice coil 1.

In later periods of time of the audio signal 30, the excursion demand curve 70 is in a range between the lower predetermined excursion level 65a and the upper predetermined excursion level 65b. A transitional auxiliary driving signal is applied in these time periods, also referred to as transitional driving signal period 63. The transitional auxiliary driving signal is an auxiliary driving signal which is adjustable in gain, and which can be adjusted gradually from zero gain, i.e. no signal, up to a high signal gain comparable to the gain of the main driving signal. During the transitional driving signal period 63, the idle auxiliary driving signal is still maintained, either as an independent driving signal from the transitional auxiliary driving signal or is embedded into the transitional auxiliary driving signal as a constant base of the transitional auxiliary driving signal.

In other periods of time of the audio signal 30, the excursion demand 70 exceeds the upper predetermined excursion level 65b (see illustration P42 in FIG. 13). These periods, also referred to as auxiliary driving signal periods 64, are time periods in which the transitional auxiliary driving signal is at its fullest. In other words, time period 64 refers to the period in which the auxiliary driving signal is at its fullest. In other embodiments of the invention, the upper predetermined excursion level is a level which represents a trigger of coupling of further auxiliary driving signals to further respective auxiliary voice coil sections for voice coils 1 comprising additional pairs of auxiliary voice coil sections.

The bottom illustration P44 of FIG. 13 shows the gain of the total auxiliary driving signal with respect to the main driving signal, i.e. zero gain represents no auxiliary driving signal at all, and a gain of 1 represents a full auxiliary driving signal with a signal strength substantially identical to the main driving signal. The gain curve inherits the same common time axis as the illustrations P41-P43. A total auxiliary driving signal may include the sum of the idle auxiliary driving signal and the transitional auxiliary driving signal, e.g. the resultant driving signal as would be measured by measuring driving signal in an auxiliary voice coil section. As seen in the example illustration P44, the gain of the auxiliary driving signal does not drop below a lower value, which is the gain, or amplitude, of the idle auxiliary driving signal. In this example, no matter how the audio signal 30 evolves, a base signal may always be applied to pairs of auxiliary voice coil sections, and back EMF braking may be avoided.

Thus, in the time period from 0 to the auxiliary driving signal transition time t1, i.e. the first idle auxiliary driving signal period 62, only an idle auxiliary driving signal may be coupled to the pair of auxiliary voice coil sections 22a-b, in addition to the main driving signal 41 which may be continuously coupled to the main voice coil section 21. In the time period from time t1 to the second auxiliary driving signal transition time t2, i.e. the first transitional auxiliary driving signal period 63, a transitional auxiliary driving signal is coupled to the pair of auxiliary voice coil sections. As seen, the transitional auxiliary driving signal is gradually changing within this time period, before it is decoupled, or turned down to zero, in the following time period from time t2 to time t3. As seen, in the time period in between time t10 and t11, i.e. an auxiliary driving signal period 64, the gain of the auxiliary driving signal is at its fullest.

Referring to FIGS. 14a-e, various configurations for generating an upper rectified driving signal 46a for an upper voice coil section 25a and a lower rectified driving signal 46b for a lower voice coil section 25b are shown according to embodiments of the invention.

In various embodiments of the invention, one or more rectification units 17 may attenuate or, preferably, block directions of current of an auxiliary driving signal 42 to generate an upper rectified driving signal 46a for an upper voice coil section 25a and a lower rectified driving signal 46b for a lower voice coil section 25b. Consequently, as current of an auxiliary driving signal flows in one direction of current, this current may substantially flow to the lower voice coil section, whereas its flow to the upper voice coil section is attenuated or blocked. Similarly, as current of an auxiliary driving signal flows in an opposite direction of current, this current may substantially flow to the upper voice coil section, whereas its flow to the lower voice coil section is attenuated or blocked. The upper rectified driving signal and lower rectified driving signals are arranged to provide current flowing in an appropriate direction of current to produce an electromotive force on the voice coil such that the audio signal is correctly reproduced.

FIG. 14a illustrates an embodiment comprising rectification units. An auxiliary driving signal 42a is provided to a rectification unit 16 to generate an upper rectified signal 46a which is provided to an upper voice coil section 25a, and an auxiliary driving signal 42b is provided to a rectification unit 16 to generate a lower rectified signal 46b which is provided to a lower voice coil section 25b. The auxiliary driving signal may be selectively coupled. Simultaneously, a main driving signal 41 is continuously coupled to a main voice coil section 21.

In some embodiments, one or more rectification units comprise at least one switching unit. One exemplary embodiment is shown in FIG. 14b. A main driving signal 41 is provided to the main voice coil section 21, while an auxiliary driving signal 42 is connected to a switching unit 10, which is controlled by a control signal 32. The switching unit 10 may either pass the auxiliary driving signal 42 to an upper voice coil section 25a or a lower voice coil section 25b. The control signal 32 provided to the switching unit 10 may ensure that one direction of current of the auxiliary driving signal 42 may pass to the upper voice coil section 25*a*, and the opposite direction of current of the auxiliary driving signal 42 may pass to the lower voice coil section 25*b*.

In other embodiments, one or more rectification units comprise at least one diode. One exemplary embodiment is shown in FIG. 14*c*. A main driving signal 41 is provided to the main voice coil section 21, while an auxiliary driving signal 42 is connected to two diodes 17. The two diodes are connected with opposite terminals, such that one of the diodes 17 primarily passes one direction of current of the auxiliary driving signal 42 and the other diode 17 primarily passes the opposite direction of current of the auxiliary driving signal. If a diode 17 passes a direction of current, it substantially blocks the opposite direction of current. As such, an upper rectified signal 46*a* may be generated after a diode 17 and passed on to an upper voice coil section 25*a*, and a lower rectified signal 46*b* may be generated after another diode 17 and passed on to a lower voice coil section 25*b*.

In some embodiments, one or more rectification units comprise at least one MOSFET, i.e. a metal-oxide-semiconductor field-effect transistor. Based on a control signal, a MOSFET 18 may be controlled to operate as a switch. One exemplary embodiment where at least one MOSFET is used according to the invention is shown in FIG. 14*d*. A main driving signal 41 is provided to the main voice coil section 21, while an auxiliary driving signal 42*a*-42*b* is provided to two MOSFETs 18, each MOSFET additionally connected to a control signal 32. Based on the control signal 32, a MOSFET 18 may allow current to pass. Preferably, one MOSFET 18 will pass one direction of current of the auxiliary driving signal to generate an upper rectified driving signal 46*a* which is provided to the upper voice coil section 25*a*, while the other MOSFET 18 will pass the opposite direction of current of the auxiliary driving signal to generate a lower rectified driving signal 46*b* which is provided to the lower voice coil section 25*b*.

In some other embodiments, one or more rectifying units comprise at least one amplifier. One exemplary embodiment is shown in FIG. 14*e*, where two amplifiers 12 are actively controlled by control signals 32 to generate the upper rectified driving signal 46*a* and the lower rectified driving signal 46*b*. A control signal 32 may determine the amplitude of the current which an amplifier may generate at its output. As such, an amplifier 12 may be controlled to only provide substantial output current when the current of the auxiliary driving signal 42 has one direction of current to generate an upper rectified driving signal 46*a*, while another amplifier 12 may be controlled to only provide substantial output current when the current of the auxiliary driving signal 42 has an opposite direction of current to generate a lower rectified driving signal 46*b*. The upper and lower rectified driving signals 46*a*-46*b* may then be provided to the upper and lower voice coil sections 25*a*-25*b*, respectively.

According to the invention, methods for generating an upper rectified driving signal 46*a* and a lower rectified driving signal 46*b* is not limited to the above described exemplary embodiments.

LIST OF REFERENCE NUMERALS

1 Voice coil
2 Magnetic circuit
3 Air gap
4 Travelling axis
5 Upward direction
6 Downward direction
7 Diaphragm
10 Switching unit
11 Optional amplification or damping element
12 Amplifier
13 Power supply unit
14 Digital signal processor
15 Excursion measurement unit
16 Rectifying unit
17 Diode
18 MOSFET
21 Main voice coil section
22*a*-*b* Auxiliary voice coil section
23*a*-*b* Auxiliary voice coil section of first pair of auxiliary voice coil sections
24*a*-*b* Auxiliary voice coil section of second pair of auxiliary voice coil sections
25*a* Upper voice coil section
25*b* Lower voice coil section
30 Audio signal
31 Processed audio signal
32 Control signal
40 Driving signal
41 Main driving signal
42, 42*a*-*b* Auxiliary driving signal
43 Main driving signal current out
44*a*-*b* Auxiliary driving signal current out
45 Signal current out
46*a* Upper rectified driving signal
46*b* Lower rectified driving signal
50 Loudspeaker
51 Voice coil driving system
52 Interface
53 Voice coil controller
60 Clockwise current direction
61 Anticlockwise current direction
62 Idle auxiliary driving signal period
63 Transitional driving signal period
64 Auxiliary driving signal period
65*a*-*b* Representation of predetermined excursion level
66*a* Peak-lock time window
66*b* Look-ahead time window
67 Audio signal peak
68 Audio signal zero crossing
70 Excursion demand
L1 BL contribution from main voice coil section
L2*a*-*b* BL contribution from auxiliary voice coil section
L3 Effective BL with 0% auxiliary driving signal gain
L4 Effective BL with 50% auxiliary driving signal gain
L5 Effective BL with 75% auxiliary driving signal gain
L6 Effective BL with 90% auxiliary driving signal gain
L7 Effective BL with 100% auxiliary driving signal gain
P11 Illustration of BL contributions from different voice coil sections
P12 Illustration of effective BL for various auxiliary voice coil gains
P21 Illustration of determination of selective coupling time based on zero-crossings of audio signal
P31 Illustration of an audio signal
P32 Illustration of determination of excursion demand based on a peak-lock time window
P33 Illustration of determination of excursion demand based on a look-ahead time window
P41 Illustration of an audio signal
P42 Illustration of excursion demand P43 Illustration of driving signal types
P44 Illustration of auxiliary driving signal gain
S1-S15 Flow chart steps
t1-t12 Auxiliary driving signal transition times

The invention claimed is:

1. A method for driving a voice coil of a loudspeaker including a magnetic circuit having an air gap and a voice coil suspended in said air gap, the method comprising:
applying an audio signal to the voice coil suspended in said air gap to produce an electromotive force configured to move the voice coil along a travelling axis,
wherein said voice coil comprises a plurality of voice coil sections, said plurality of voice coil sections comprising a main voice coil section, and a pair of auxiliary voice coil sections arranged along said travelling axis with voice coil sections of said pair of auxiliary voice coil sections arranged respectively on either side of said main voice coil section,
wherein said applying an audio signal comprises continuously coupling a main driving signal based on said audio signal to said main voice coil section and selectively coupling an auxiliary driving signal based on said audio signal to said pair of auxiliary voice coil sections, and
wherein said main driving signal and said auxiliary driving signal are configured to cause current to flow in a same azimuthal direction around said travelling axis of said voice coil.

2. The method for driving a voice coil according to claim 1, wherein said selectively coupling said auxiliary driving signal to said pair of auxiliary voice coil sections is performed on the basis of a representation of excursion demand.

3. The method for driving a voice coil according to claim 2, wherein said selectively coupling said auxiliary driving signal to said pair of auxiliary voice coil sections is performed on the basis of a comparison of said representation of excursion demand with a representation of a predetermined excursion level.

4. The method for driving a voice coil according to claim 3, wherein said representation of excursion demand comprises a property of said audio signal and said representation of a predetermined excursion level is a threshold related to said property of said audio signal.

5. The method for driving a voice coil according to claim 4, wherein said property of said audio signal relates to an amplitude of said audio signal.

6. The method for driving a voice coil according to claim 3, wherein said representation of excursion demand is based on measuring a voice coil excursion by using at least one position sensor and said representation of a predetermined excursion level is a threshold related to the voice coil excursion.

7. The method for driving a voice coil according to claim 3, wherein said representation of excursion demand is based on current and/or voltage in the voice coil sections, and representation of a predetermined excursion level is a threshold related to current and/or voltage in the voice coil sections.

8. The method for driving a voice coil according to claim 2, wherein said representation of excursion demand is established on the basis of a signal analysis of said audio signal.

9. The method for driving a voice coil according to claim 1, wherein said selectively coupling an auxiliary driving signal to said pair of auxiliary voice coil sections is performed by a voice coil controller comprising a signal processor.

10. The method for driving a voice coil according to claim 9, wherein said signal processor of said voice coil controller is a digital signal processor.

11. The method for driving a voice coil according to claim 1, wherein said pair of auxiliary voice coil sections includes a first pair of auxiliary voice coil sections, and said auxiliary driving signal is a first auxiliary driving signal; and
wherein said plurality of voice coil sections further comprises a second pair of auxiliary voice coil sections arranged along said travelling axis with voice coil sections of said second pair of auxiliary voice coil sections arranged respectively on either side of said first pair of auxiliary voice coil sections; and
wherein said step of applying an audio signal comprises selectively coupling a second auxiliary driving signal to said second pair of auxiliary voice coil sections on the basis of said audio signal.

12. The method for driving a voice coil according to claim 11, wherein said representation of a predetermined excursion level includes a first representation of a predetermined excursion level and wherein said selectively coupling said second auxiliary driving signal to said second pair of auxiliary voice coil sections is performed on the basis of a comparison of said representation of excursion demand with a second representation of predetermined excursion level.

13. The method for driving a voice coil according to claim 12, wherein said second representation of predetermined excursion level is greater than said first representation of predetermined excursion level.

14. The method for driving a voice coil according to claim 11, wherein said first pair of auxiliary voice coil sections is arranged along said travelling axis and arranged symmetrically around said main voice coil section with one auxiliary voice coil section of said first pair of auxiliary voice coil sections on either side of said main voice coil section and said second pair of auxiliary voice coil sections being arranged along said travelling axis and arranged symmetrically around said main voice coil section with one auxiliary voice coil section of said second pair of auxiliary voice coil sections on either side of said main voice coil section.

15. The method for driving a voice coil according to claim 1, wherein said pair of auxiliary voice coil sections is arranged along said travelling axis and arranged symmetrically around said main voice coil section with one auxiliary voice coil section of said pair of auxiliary voice coil sections on either side of said main voice coil section.

16. The method for driving a voice coil according to claim 1, wherein said selectively coupling an auxiliary driving signal to said pair of auxiliary voice coil sections comprises controlling at least one amplifier to couple said auxiliary driving signal to said pair of auxiliary voice coil sections.

17. The method for driving a voice coil according to claim 16, wherein said controlling at least one amplifier comprises generating said auxiliary driving signal or an idle auxiliary driving signal and/or a transitional auxiliary driving signal on the basis of said comparison of said representation of excursion demand with a representation of a predetermined excursion level.

18. The method for driving a voice coil according to claim 1, wherein said continuously coupling a main driving signal to said main voice coil section comprises coupling said main driving signal by use of an amplifier.

19. The method for driving a voice coil according to claim 1, wherein said auxiliary driving signal includes a gain different from a gain of said main driving signal.

20. The method for driving a voice coil according to claim 1, wherein said auxiliary driving signal includes a gain substantially equal to a gain of said main driving signal.

21. The method for driving a voice coil according to claim 1, wherein said selectively coupling an auxiliary driving signal to said pair of auxiliary voice coil sections comprises controlling at least one switch to couple said auxiliary driving signal to said pair of auxiliary voice coil sections.

22. The method for driving a voice coil according to claim 1, wherein an idle auxiliary driving signal is coupled to said pair of auxiliary voice coil sections.

23. The method for driving a voice coil according to claim 22, wherein said idle auxiliary driving signal is based on said audio signal.

24. The method for driving a voice coil according to claim 23, wherein said idle auxiliary driving signal is a first idle auxiliary driving signal and said pair of auxiliary voice coil sections is a first pair of auxiliary voice coil sections and wherein a second idle auxiliary driving signal is coupled to a second pair of auxiliary voice coil sections.

25. The method for driving a voice coil according to claim 24, wherein said first idle auxiliary driving signal and said second idle auxiliary driving signal are different in at least one respect.

26. The method for driving a voice coil according to claim 22, wherein the amplitude of said idle auxiliary driving signal is in the interval from 1% to 99% of said main driving signal.

27. The method for driving a voice coil according to claim 22, wherein said main driving signal includes a gain, and wherein said idle auxiliary driving signal has a gain in the interval from 1% to 99% of said gain of said main driving signal.

28. The method for driving a voice coil according to claim 22, wherein said selectively coupling said auxiliary driving signal to said pair of auxiliary voice coil sections comprises selectively coupling a transitional auxiliary driving signal based on said audio signal.

29. The method for driving a voice coil according to claim 28, wherein said selectively coupling a transitional auxiliary driving signal comprises controlling a gain of said transitional auxiliary driving signal.

30. The method for driving a voice coil according to claim 29, wherein said gain of said transitional auxiliary driving signal is adjusted on the basis of an analysis of said audio signal.

31. The method for driving a voice coil according to claim 29, wherein said gain of said transitional auxiliary driving signal is adjusted on the basis of said representation of excursion demand.

32. The method for driving a voice coil according to claim 29, wherein said gain adjustment of said transitional auxiliary driving signal is slew rate limited.

33. The method for driving a voice coil according to claim 28, wherein said selectively coupling said transitional auxiliary driving signal comprises controlling one or more amplifiers.

34. The method for driving a voice coil according to claim 28, wherein said selectively coupling said transitional auxiliary driving signal comprises controlling one or more switches.

35. The method for driving a voice coil according to claim 1, wherein said magnetic circuit includes a magnet.

36. The method for driving a voice coil according to claim 35, wherein said magnet is a permanent magnet.

37. The method for driving a voice coil according to claim 35, wherein said magnet is an electromagnet.

38. The method for driving a voice coil according to claim 1, wherein said main voice coil section has a height measured in a direction along said travelling axis which is greater than a height of said air gap measured in said direction along said travelling axis.

39. The method for driving a voice coil according to claim 38, wherein each voice coil section of said pair of auxiliary voice coil sections has a height measured in a direction along said travelling axis which is smaller than said height of said main voice coil section.

40. The method for driving a voice coil according to claim 38, wherein each voice coil section of said second pair of auxiliary voice coil sections has a height measured in a direction along said travelling axis which is smaller than said height of said main voice coil section.

41. The method for driving a voice coil according to claim 1, wherein said selectively coupling an auxiliary driving signal based on said audio signal comprises maintaining said coupling for a duration of time comprising at least two zero-crossings of said audio signal.

42. The method for driving a voice coil according to claim 41, wherein said duration of time is a predetermined duration of time.

43. The method for driving a voice coil according to claim 42, wherein said predetermined duration of time is in the range of 50 milliseconds to 10 seconds.

44. The method for driving a voice coil according to claim 42, wherein said predetermined duration of time is established on the basis of a signal analysis of said audio signal.

45. The method for driving a voice coil according to claim 44, wherein said signal analysis is performed on a section of time of said audio signal.

46. The method for driving a voice coil according to claim 45, wherein said section of time is identical to said time delay.

47. The method for driving a voice coil according to claim 44, wherein said signal analysis of said audio signal comprises peak-analysis of said audio signal.

48. The method for driving a voice coil according to claim 44, wherein said signal analysis is performed on said audio signal repeatedly.

49. The method for driving a voice coil according to claim 1, wherein said main driving signal and said auxiliary driving signal are delayed by a time delay with respect to said audio signal.

50. The method for driving a voice coil according to claim 1,
wherein said selective coupling of said auxiliary driving signal is based on a user defined input selection.

51. The method for driving a voice coil according to claim 1, wherein said pair of auxiliary voice coil sections comprise an upper voice coil section and a lower voice coil section, said upper voice coil section and said lower voice coil section arranged respectively on either side of said main voice coil section along said travelling axis.

52. The method for driving a voice coil according to claim 51, wherein said providing an auxiliary driving signal comprises providing an upper rectified driving signal to said upper voice coil section and providing a lower rectified driving signal to said lower voice coil section;
wherein said upper rectified driving signal is provided by attenuating, such as blocking, a first direction of current of said auxiliary driving signal;
wherein said lower rectified driving signal is provided by attenuating, such as blocking, a second direction of current of said auxiliary driving signal; and wherein said first and second direction of current of said auxiliary driving signal are opposite directions of current.

53. The method for driving a voice coil according to claim 52, wherein said providing said upper rectified driving signal comprises processing said auxiliary driving signal using an upper rectifying unit and said providing said lower rectified driving signal comprises processing said auxiliary driving signal using a lower rectifying unit.

54. The method for driving a voice coil according to claim 53, wherein said upper rectified driving signal is provided by rectifying said auxiliary driving signal in said first direction of current and wherein said lower rectified driving signal is provided by rectifying said auxiliary driving signal in said second direction of current.

55. The method for driving a voice coil according to claim 54, wherein said rectifying comprises passive rectifying.

56. The method for driving a voice coil according to claim 54, wherein said rectifying said auxiliary driving signal includes half-wave rectification.

57. The method for driving a voice coil according to claim 53, wherein said upper rectifying unit comprises a rectifying circuit, and wherein said lower rectifying unit comprises a rectifying circuit.

58. The method for driving a voice coil according to claim 53, wherein said upper rectifying unit comprises a diode and wherein said lower rectifying unit comprises a diode.

59. The method for driving a voice coil according to claim 53, wherein said upper rectifying unit comprises a switch and wherein said lower rectifying unit comprises a switch.

60. The method for driving a voice coil according to claim 53, wherein said upper rectifying unit comprises an amplifier and wherein said lower rectifying unit comprises an amplifier.

61. A voice coil driving system of a loudspeaker comprising:
a magnetic circuit having an air gap;
a voice coil suspended in said air gap, said voice coil comprising a plurality of voice coil sections, said plurality of voice coil sections comprising a main voice coil section, and a pair of auxiliary voice coil sections arranged along a travelling axis with voice coil sections of said pair of auxiliary voice coil sections arranged respectively on either side of said main voice coil section; and
a voice coil controller arranged to cause application of an audio signal to said voice coil suspended in the air gap to produce an electromotive force configured to move said voice coil along said travelling axis, wherein said applying an audio signal comprises continuously coupling a main driving signal based on said audio signal to said main voice coil section and selectively coupling an auxiliary driving signal based on said audio signal to said pair of auxiliary voice coil sections,
wherein said main driving signal and said auxiliary driving signal are configured to cause current to flow in a same azimuthal direction around said travelling axis of said voice coil.

62. The voice coil driving system of claim 61, wherein said voice coil controller is arranged to carry out the method according to claim 1.

63. The voice coil driving system of claim 61, wherein said voice coil controller is arranged to selectively couple said auxiliary driving signal to said pair of auxiliary voice coil sections on the basis of a representation of excursion demand.

64. The voice coil driving system of claim 61, wherein said pair of auxiliary voice coil sections is a first pair of auxiliary voice coil sections and said auxiliary driving signal is a first auxiliary driving signal and wherein said voice coil further comprises a second pair of auxiliary voice coil sections and said voice controller is arranged to selectively couple a second auxiliary driving signal to said second pair of auxiliary voice coil sections.

65. The voice coil driving system of claim 61, wherein said voice coil controller comprises a signal processor.

66. The voice coil driving system of claim 61, wherein said voice coil driving system comprises one or more amplifiers.

67. The voice coil driving system of claim 61, wherein said voice coil driving system comprises a switching unit.

68. A loudspeaker comprising:
a diaphragm;
an interface configured to receive an audio signal; and
a voice coil driving system according to claim 61.

* * * * *